(12) United States Patent
Iezawa et al.

(10) Patent No.: US 11,296,630 B2
(45) Date of Patent: Apr. 5, 2022

(54) CONTROLLER FOR ROTARY ELECTRIC MACHINE APPARATUS

(71) Applicant: Mitsubishi Electric Corporation, Tokyo (JP)

(72) Inventors: Masahiro Iezawa, Tokyo (JP); Shingo Kato, Tokyo (JP); Noriyuki Wada, Tokyo (JP); Hideaki Kawamoto, Tokyo (JP); Kotaro Nakano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/082,221

(22) Filed: Oct. 28, 2020

(65) Prior Publication Data

US 2021/0211078 A1 Jul. 8, 2021

(30) Foreign Application Priority Data

Jan. 7, 2020 (JP) .............................. JP2020-000641

(51) Int. Cl.
*H02P 21/02* (2006.01)
*H02P 27/08* (2006.01)
(Continued)

(52) U.S. Cl.
CPC ........ *H02P 21/02* (2013.01); *G01R 19/16538* (2013.01); *H02P 21/0089* (2013.01);
(Continued)

(58) Field of Classification Search
CPC ...... H02P 1/00; H02P 1/04; H02P 1/16; H02P 1/163; H02P 1/18; H02P 1/24; H02P 1/26;
(Continued)

(56) References Cited

U.S. PATENT DOCUMENTS

2007/0278986 A1* 12/2007 Okamura .............. B60W 20/15
318/798
2014/0139156 A1* 5/2014 Hayashi .................. B60L 15/06
318/400.3
2017/0264232 A1 9/2017 Iezawa et al.

FOREIGN PATENT DOCUMENTS

JP 2007325351 A 12/2007
JP 5652549 B2 1/2015
JP 2017163643 A 9/2017

OTHER PUBLICATIONS

Communication dated Jan. 6, 2021, from the Japanese Patent Office in Application No. 2020-000641.

* cited by examiner

*Primary Examiner* — Antony M Paul
(74) *Attorney, Agent, or Firm* — Sughrue Mion, PLLC; Richard C. Turner

(57) ABSTRACT

To provide a controller for rotary electric machine apparatus which can calculate the voltage command value of the converter which reduces power loss with good accuracy, in the case where the normal modulation control and the overmodulation control are switched and performed. A controller for rotary electric machine apparatus sets a system voltage that power loss becomes the minimum as the converter voltage command value, based on a power loss characteristics of the normal modulation control which is a power loss characteristics of at least the inverter with respect to the system voltage in performing the normal modulation control, and a power loss characteristics of the overmodulation control which is a power loss characteristics of at least the inverter with respect to the system voltage in performing the overmodulation control.

12 Claims, 16 Drawing Sheets

(51) Int. Cl.
*G01R 19/165* (2006.01)
*H02P 21/18* (2016.01)
*H02P 21/00* (2016.01)
*H02P 21/22* (2016.01)
*H02P 21/20* (2016.01)

(52) U.S. Cl.
CPC .............. *H02P 21/18* (2016.02); *H02P 21/20* (2016.02); *H02P 21/22* (2016.02); *H02P 27/08* (2013.01)

(58) Field of Classification Search
CPC .... H02P 1/265; H02P 1/28; H02P 1/42; H02P 1/423; H02P 1/46; H02P 1/465; H02P 1/54; H02P 3/00; H02P 3/14; H02P 4/00; H02P 5/00; H02P 6/00; H02P 6/005; H02P 6/04; H02P 6/10; H02P 6/12; H02P 6/08; H02P 6/28; H02P 7/29; H02P 21/00; H02P 21/0021; H02P 21/0089; H02P 21/04; H02P 21/14; H02P 21/22; H02P 23/00; H02P 23/0027; H02P 23/0086; H02P 23/14; H02P 25/022; H02P 25/062; H02P 27/00; H02P 27/04; H02P 27/06; H02P 27/085; H02P 29/00; H02P 2201/09; H02P 2201/07; H02P 2207/00; H02P 2207/076
See application file for complete search history.

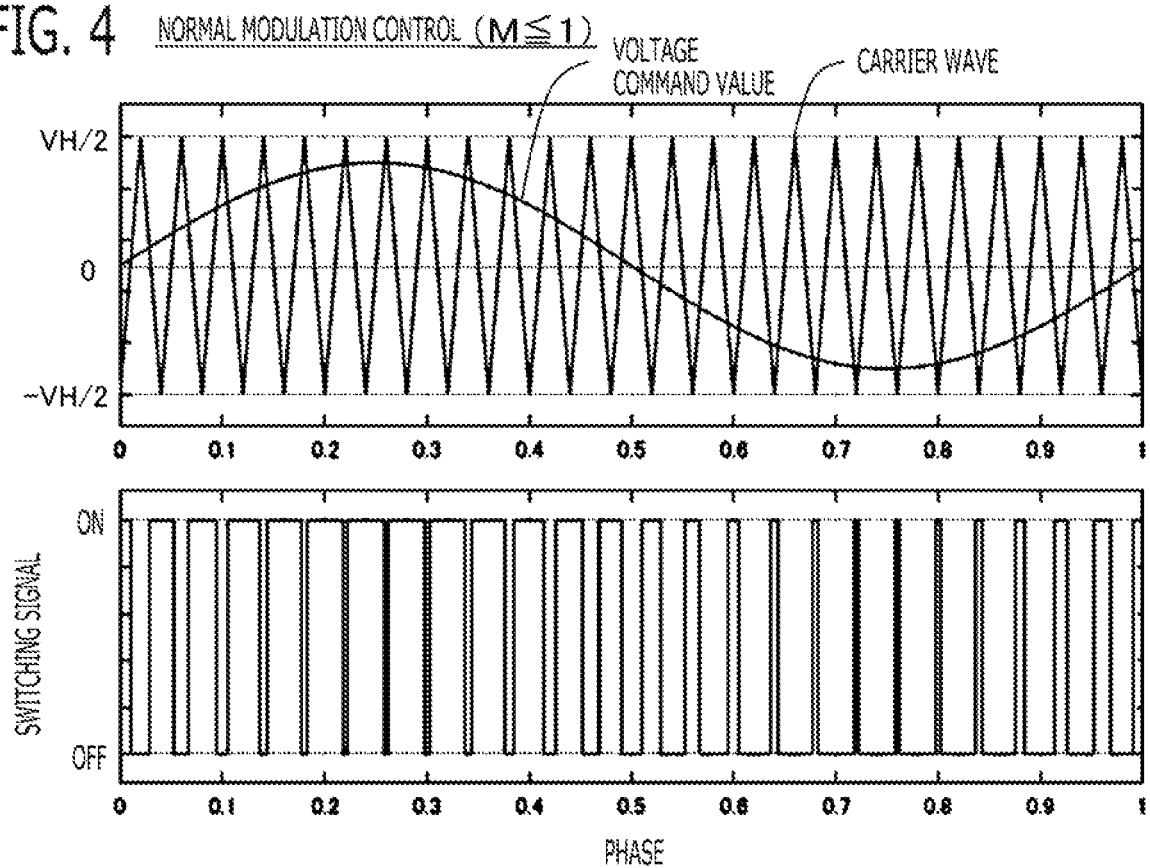

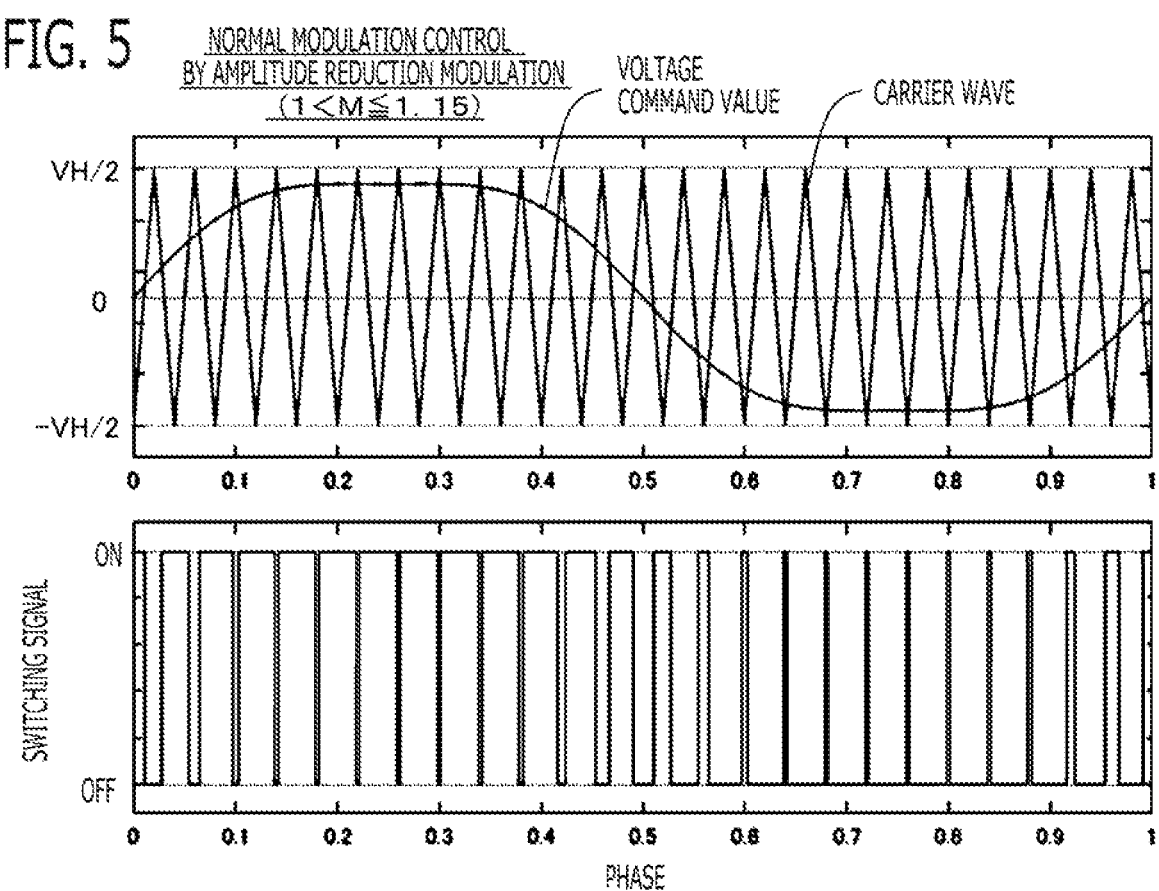

FIG. 6  OVERMODULATION CONTROL ($1.15 < M \leq 1.27$)
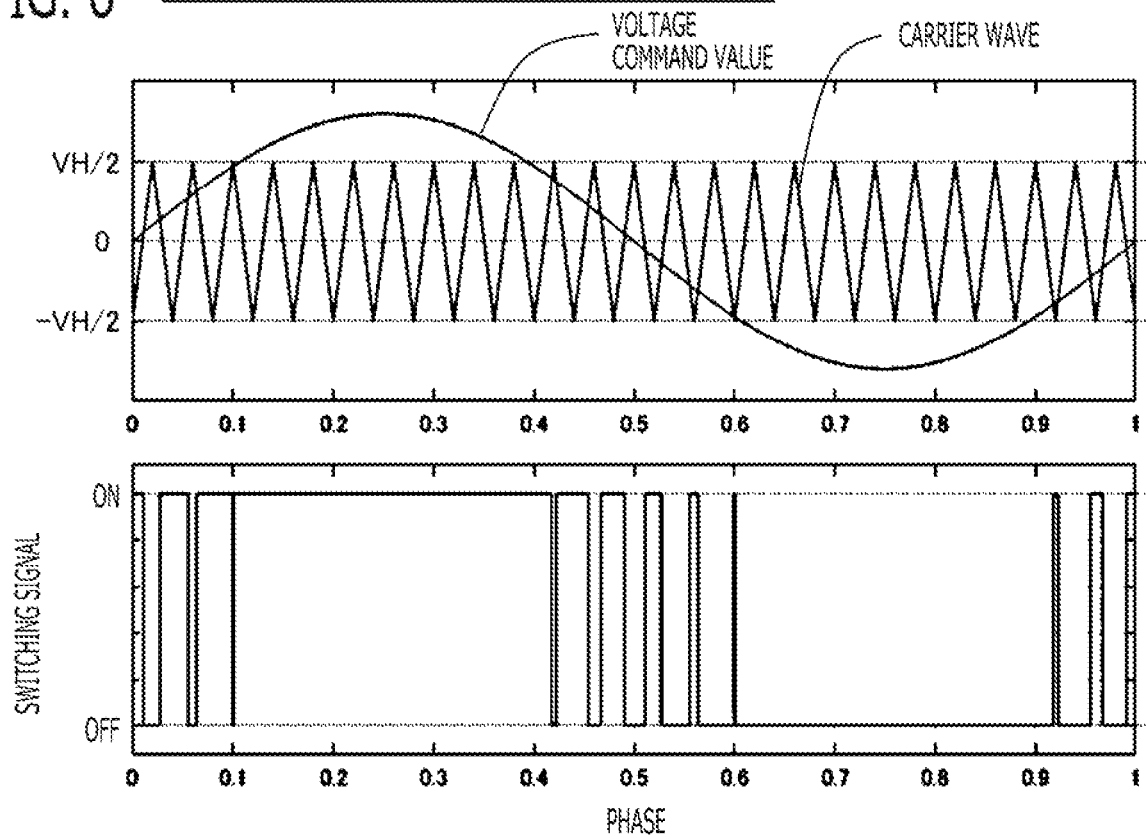
FIG. 7
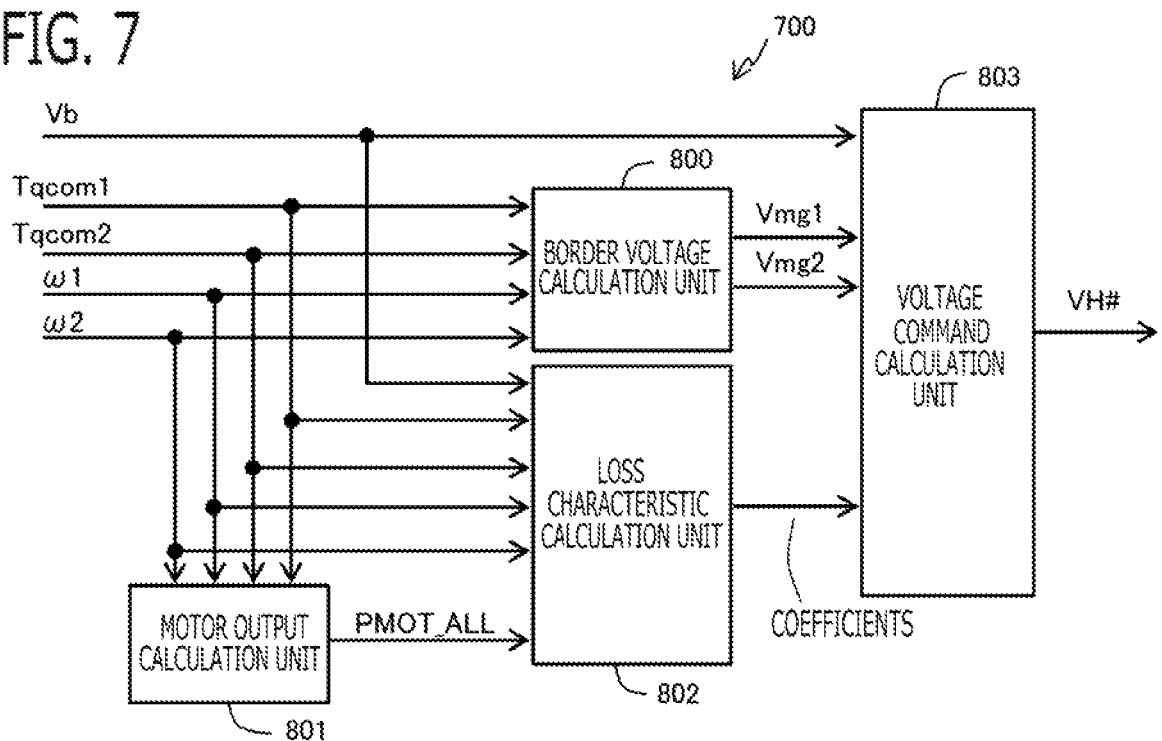

FIG. 12
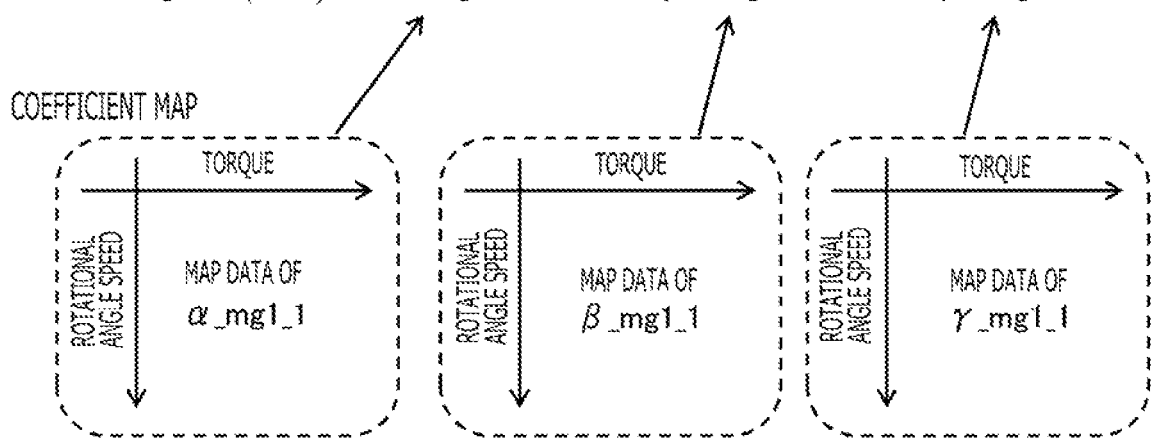
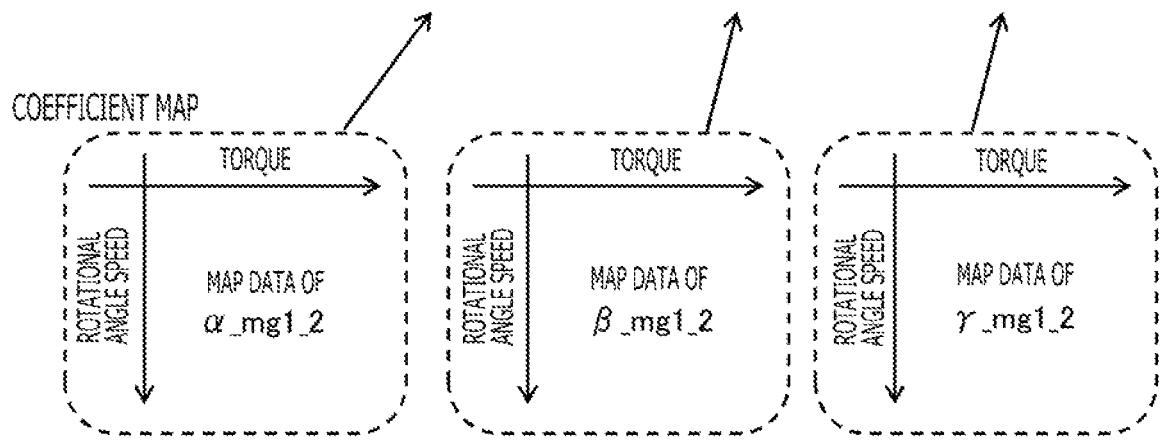

FIG. 13
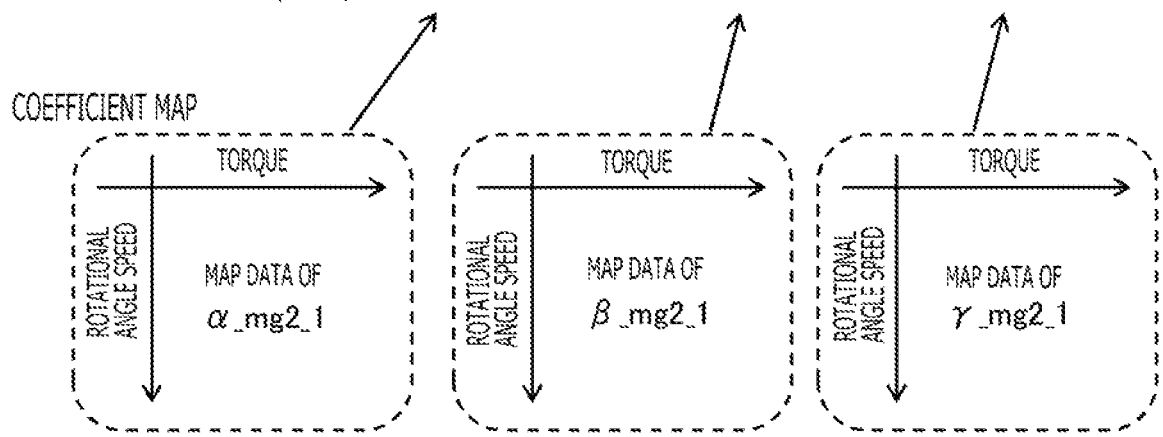
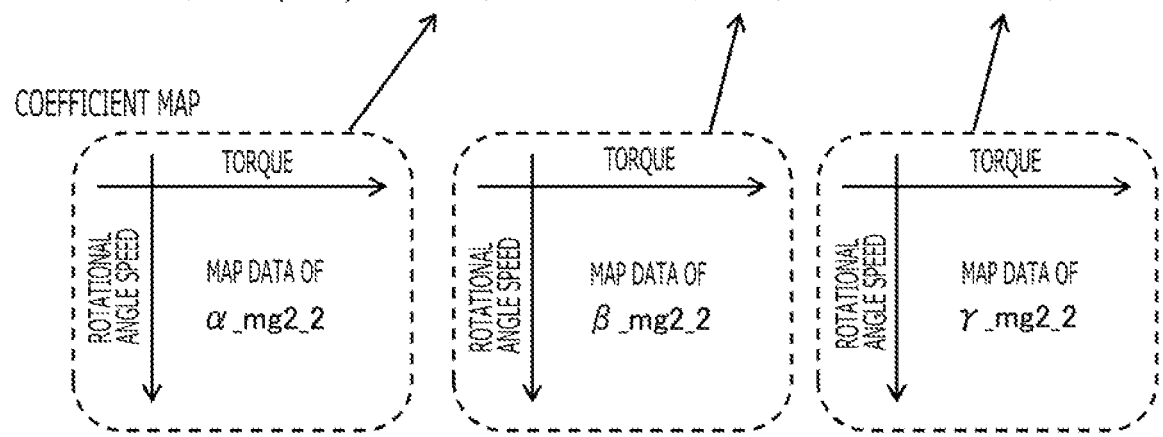

$$\text{Ploss\_dcdc}(VH) = \alpha\_\text{dcdc} \cdot VH^2 + \beta\_\text{dcdc} \cdot VH + \gamma\_\text{dcdc}$$

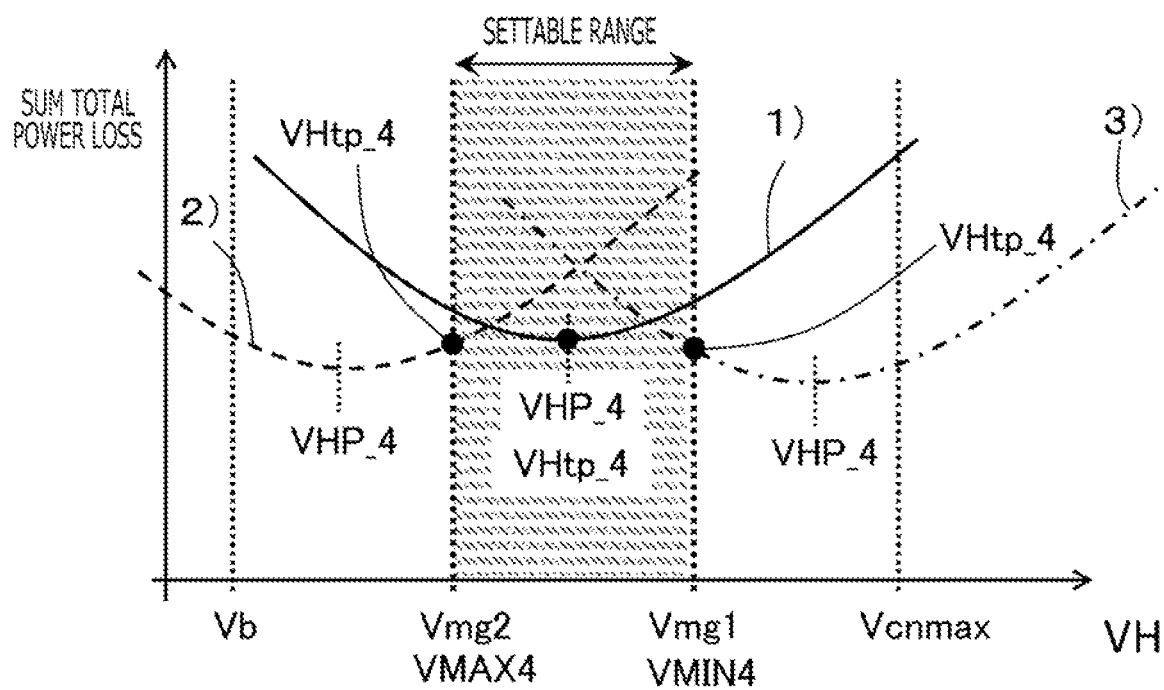
FIG. 19 FOURTH COMBINATION
(MG1: OVERMODULATION CONTROL, MG2: NORMAL MODULATION CONTROL)
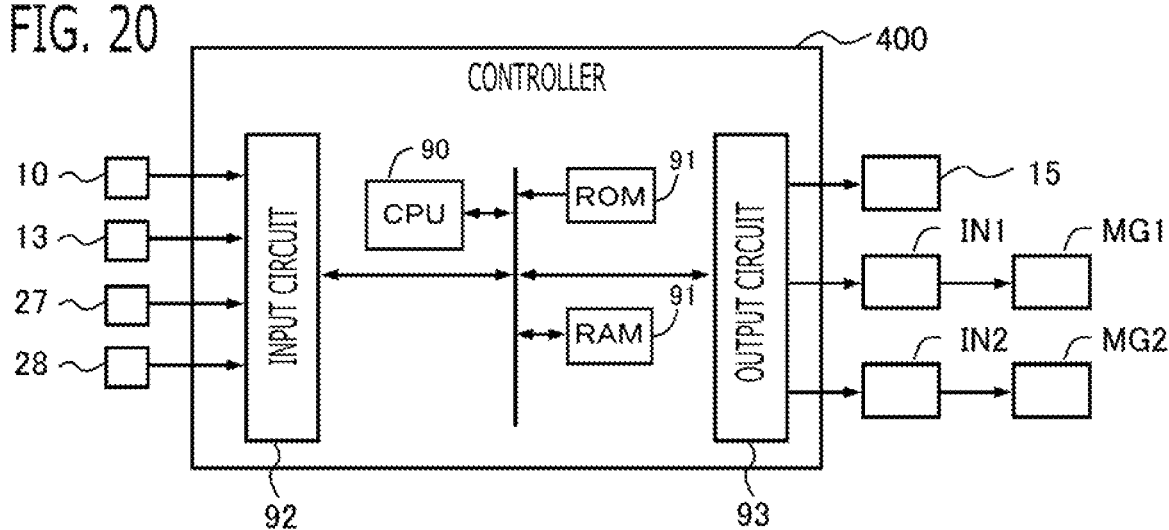
FIG. 20

CONTROLLER FOR ROTARY ELECTRIC MACHINE APPARATUS

INCORPORATION BY REFERENCE

The disclosure of Japanese Patent Application No. 2020-00641 filed on Jan. 7, 2020 including its specification, claims and drawings, is incorporated herein by reference in its entirety.

BACKGROUND

The present disclosure relates to a controller for rotary electric machine apparatus.

With regard to the above controller for rotary electric machine apparatus, the technology described in JP 5652549 B is already known. JP 5652549 B discloses the rotary electric machine that the output voltage of the converter is shared with a plurality of inverters, and a plurality of rotary electric machines are controlled. In the technology of JP 5652549 B, about each of a plurality of candidates of the voltage command value of the converter, the power loss of the DC power source, the power loss of the converter, the power losses of the plurality of inverters, and these sum total power loss are calculated; a voltage at which the sum total power loss becomes the minimum is searched from the plurality of candidate voltages; and the searched voltage is set as the voltage command value of the converter. In the technology of a JP 5652549 B, the map data of each power loss in which the direct current voltage, the rotational angle speed of the rotary electric machine, the torque, and the like are set as the arguments is memorized, and each power lose is calculated using the map data.

SUMMARY

However, in the technology of JP 5652549 B, without distinguishing each power loss characteristics of the normal modulation control in which amplitudes of the three-phase voltage command values become less than or equal to the half value of the system voltage and the overmodulation control in which the amplitudes of the three-phase voltage command values exceed the half value of the system voltage, both are collectively set as the PMW control mode. Then, in the technology of JP 5652549 B, the power loss characteristics of each of the PWM control mode and the rectangular wave PWM control mode is approximated by the quadratic function with respect to the system voltage.

However, between the power loss characteristics of the normal modulation control, and the power loss characteristics of the overmodulation control, the trends of characteristics are largely different. Therefore, if both are collectively approximated like JP 5652549 B, the approximate error becomes large, and there is a possibility that the calculation accuracy of the system voltage which makes power loss of the whole system the minimum may be deteriorated.

Thus, in the case where the normal modulation control and the overmodulation control are switched and performed, it is desired to provide a controller for rotary electric machine apparatus which can calculate the voltage command value of the converter which reduces power loss with good accuracy.

A controller for rotary electric machine apparatus according to the present disclosure that controls a rotary electric machine apparatus which is provided with a rotary electric machine which has plural-phase windings, a converter which can raise a power source voltage of a direct current power source to output to a system voltage line, and an inverter which is provided between the converter and the rotary electric machine and performs power conversion between the direct current power of the system voltage line and alternating current power which drives the rotary electric machine, the controller for rotary electric machine apparatus including:

a converter voltage command calculation unit that calculates a converter voltage command value within a range of greater than or equal to the power source voltage and less than or equal to an output upper limit voltage of the converter, a converter control unit that controls the converter so that a system voltage which is a direct current voltage of the system voltage line approaches the converter voltage command value, and an inverter control unit that calculates plural-phase voltage command values, and controls the inverter based on the plural-phase voltage command values to apply voltages to the plural-phase windings, wherein the inverter control unit switches and performs a normal modulation control in which amplitudes of the plural-phase voltage command values become less than or equal to a half value of the system voltage, and an overmodulation control in which the amplitudes of the plural-phase voltage command values exceed the half value of the system voltage, and wherein the converter voltage command calculation unit sets the system voltage that a power loss becomes a minimum, as the converter voltage command value, based on a power loss characteristics of the normal modulation control which is a power loss characteristics of at least the inverter with respect to the system voltage in performing the normal modulation control, and a power loss characteristics of the overmodulation control which is a power loss characteristics of at least the inverter with respect to the system voltage in performing the overmodulation control.

According to the controller for rotary electric machine apparatus of the present disclosure, the power loss characteristics of the normal modulation control and the power loss characteristics of the overmodulation control, which are different in trend of characteristics, are calculated individually, and the converter voltage command value that the power loss becomes the minimum can be determined with good accuracy, based on two power loss characteristics.

BRIEF DESCRIPTION OF THE DRAWINGS

FIG. 4 is a figure for explaining the normal modulation control according to Embodiment 1;

FIG. 5 is a figure for explaining the normal modulation control by the amplitude reduction modulation according to Embodiment 1;

FIG. 6 is a figure for explaining the overmodulation control according to Embodiment 1;

FIG. 7 is a block diagram of the converter voltage command calculation unit according to Embodiment 1;

FIG. 12 is a figure for explaining the polynomial representing the power loss characteristics of the first inverter and the first rotary electric machine, and calculation of its coefficients according to Embodiment 1;

FIG. 13 is a figure for explaining the polynomial representing the power loss characteristics of the second inverter and the second rotary electric machine, and calculation of its coefficients according to Embodiment 1;

FIG. 19 is a figure for explaining calculation of the candidate value of the converter voltage command value of the fourth combination according to Embodiment 1; and FIG. 20 is a hardware configuration diagram of the controller according to Embodiment 1.

DETAILED DESCRIPTION OF THE EMBODIMENTS

1. Embodiment 1

Figure 1:
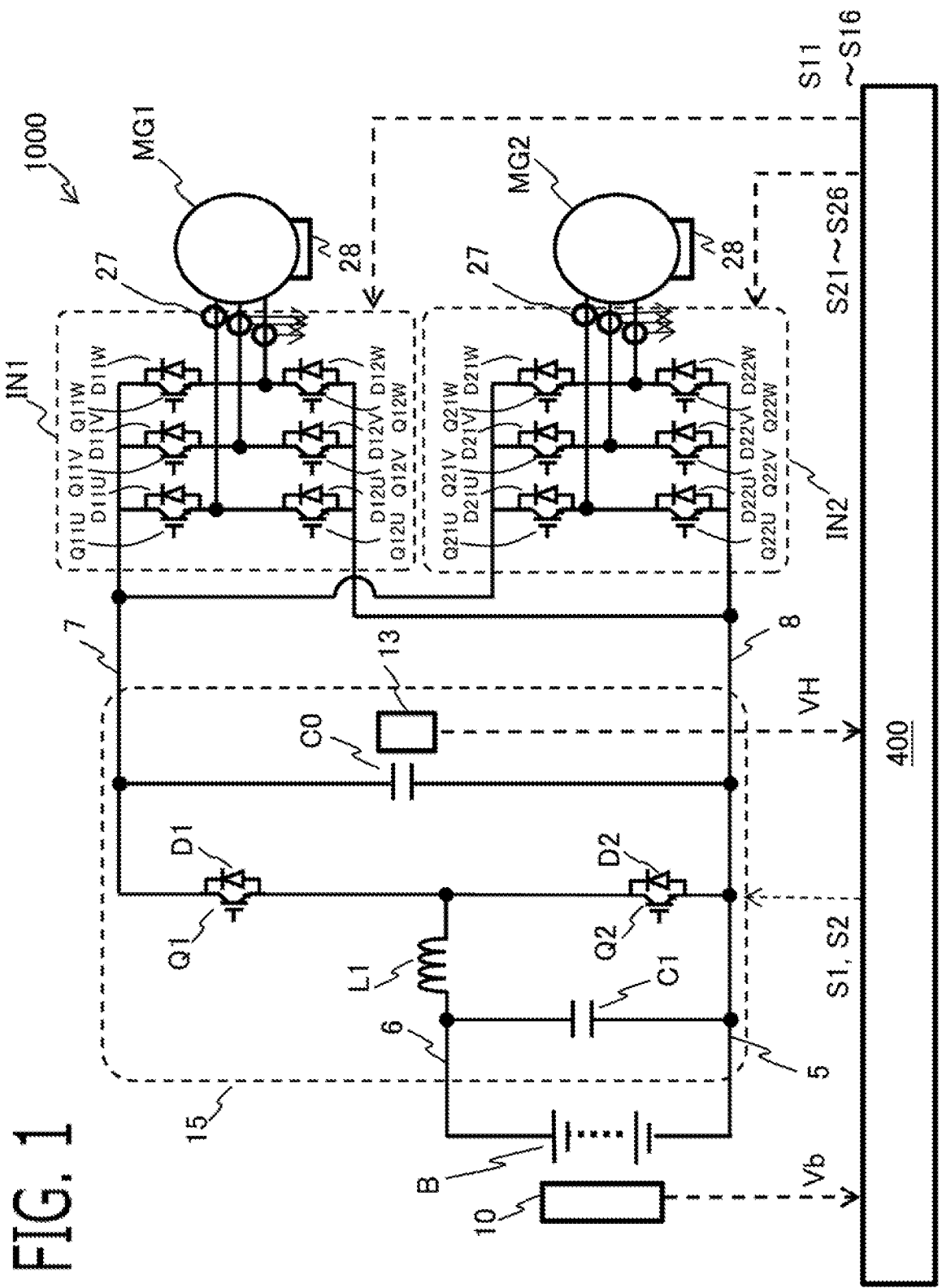
FIG. 1 is a configuration diagram of the rotary electric machine apparatus and the controller according to Embodiment 1.
Figure 2:
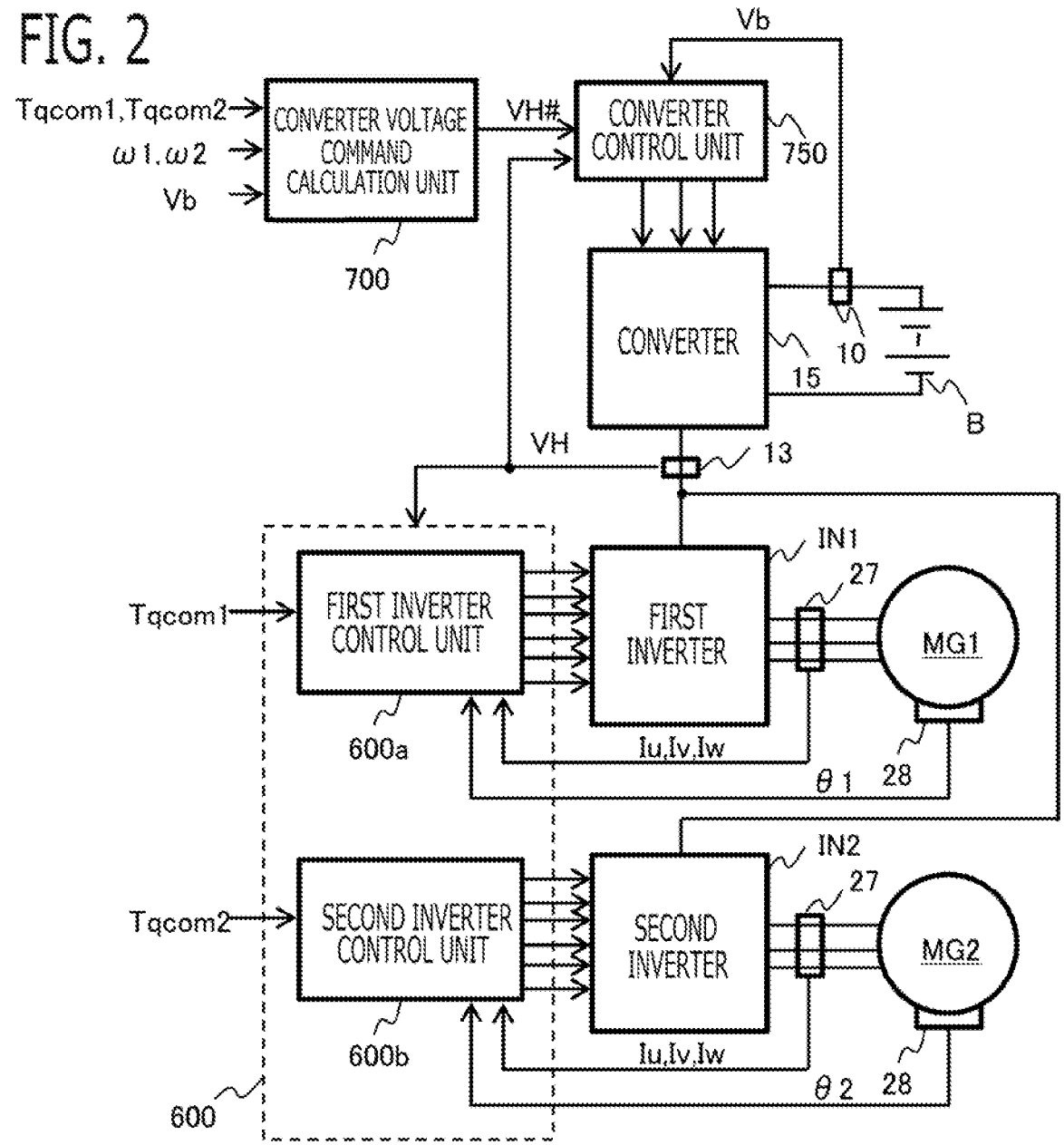
FIG. 2 is a schematic block diagram of the controller according to Embodiment 1.

A controller 400 for a rotary electric machine apparatus 1000 (hereinafter, referred to simply as the controller 400) according to Embodiment 1 will be explained with reference to the drawings. FIG. 1 is a schematic configuration diagram of the rotary electric machine apparatus 1000 and the controller 400 according to Embodiment 1 of the present disclosure.

The rotary electric machine apparatus 1000 is provided with a rotary electric machine MG, a converter 15, and an inverter IN. The rotary electric machine MG has plural-phase windings (in this example, three-phase). The converter 15 can raise a power source voltage Vb of a direct current power source B to output to system voltage lines 7, 8. The inverter IN is provided between the converter 15 and the rotary electric machine MG, and performs power conversion between the direct current power of the system voltage lines 7 and 8 and an alternating current power which drives the rotary electric machine MG.

1-1. Rotary Electric Machine

In the present embodiment, the rotary electric machine MG is used as a driving force source of wheels, and the rotary electric machine apparatus 1000 and the controller 400 are mounted on a vehicle (in this example, a hybrid vehicle).

In the present embodiment, a plurality of sets (in this example, 2 sets) of the rotary electric machine MG and the inverter IN are provided. A first rotary electric machine MG1 and a first inverter IN1 for the first rotary electric machine MG1, and a second rotary electric machine MG2 and a second inverter IN2 for the second rotary electric machine MG2 are provided.

Each of the first and the second rotary electric machine MG1, MG2 is provided with a stator fixed to a nonrotation member, and a rotor which is disposed in radial-direction inner side of the stator and supported rotatably. In the present embodiment, the rotary electric machine MG is a rotary electric machine of the permanent magnet synchronous type, the stator is provided with three-phase windings, and the rotor is provided with permanent magnets. Each of the first and the second rotary electric machine MG1, MG2 has a function of an electric motor and an electric generator.

In the present embodiment, the first rotary electric machine MG1 operates as the electric generator driven by an internal combustion engine (not shown), and operates as the electric motor which starts the internal combustion engine. The second rotary electric machine MG2 is connected with the wheels via an output axis and reduction gears, which are not shown, operates as the electric motor which drives the wheels, and operates as the electric generator which performs regenerative power generation by a driving force of the wheels.

Each of the first and the second rotary electric machine MG1, MG2 is provided with a rotational angle sensor 28 (for example, a resolver) for detecting a rotational angle θ of the rotor. An output signal of the each rotational angle sensor 28 is inputted to the controller 400. The controller 400 detects each rotational angle θ1, θ2 of the first and the second rotary electric machine MG1, MG2 based on the output signal of the each rotational angle sensor 28, and calculates each rotational angle speed ω1, ω2 of the first and the second rotary electric machine MG1, MG2 based on the each rotational angle θ1, θ2.

1-2. Direct Current Power Source

A secondary battery, such as a nickel hydrogen or a lithium ion, is used for the direct current power source B. An electrical double layer capacitor and the like may be used for the direct current power source B. A positive electrode terminal of the direct current power source B is connected to a power source side positive electric line 6 of the converter 15, and a negative electrode terminal of the direct current power source B is connected to a power source side negative electric line 5 of the converter 15. A power source voltage sensor 10 for detecting a power source voltage Vb of the direct current power source B is provided. An output signal of the power source voltage sensor 10 is inputted to the controller 400.

1-3. Converter

A converter 15 is connected between the direct current power source B and the system voltage lines 7, 8, and is a DC-DC converter which converts direct current power. In the present embodiment, the converter 15 is a voltage boosting and dropping converter having a function of a voltage boosting chopper which boosts a power source voltage Vb of the direct current power source B and outputs to the system voltage lines 7, 8, and a function of a voltage dropping chopper which drops a system voltage VH which is a DC voltage of the system voltage lines 7, 8 and outputs to the direct current power source B. The converter 15 is provided with a reactor, a switching device, and a free wheel diode at least.

The converter 15 is provided with a smoothing capacitor C1 connected between the power source side positive electric line 6 and the power source side negative electric line 5.

A relay (not shown), which is turned on at the time of vehicle operation and turned off at the time of a vehicle operation stop, is provided between the positive electrode terminal of the direct current power source B and the power source side positive electric lines 6, and between the negative electrode terminal of the direct current power source B and the power source side negative electric lines 5.

The converter 15 is provided with a reactor L1, two switching devices Q1, Q2, two free wheel diodes D1, D2, and a smoothing capacitor C0. Each of free-wheel diodes D1, D2 is connected in inverse parallel with each of the switching devices Q1, Q2, respectively. The two switching devices Q1, Q2 are connected in series between the positive electrode side system voltage line 7 and the negative electrode side system voltage line 8. The reactor L1 is connected between a connection node connecting the two switching devices Q1, Q2, and the power source side positive electric line 6. The smoothing capacitor C0 is connected between the positive electrode side system voltage line 7 and the negative electrode side system voltage line 8.

Between the positive electrode side system voltage line 7 and the negative electrode side system voltage line 8, a system voltage sensor 13 for detecting the system voltage VH of the system voltage lines 7, 8 is provided. An output signal of the system voltage sensor 13 is inputted to the controller 400. Each of the two switching devices Q1, Q2 is controlled on/off by each of converter control signals S1, S2 outputted from the controller 400.

1-4. Inverter

The DC-voltage side of the first inverter IN1 and the second inverter IN2 are connected to the converter 15 via the common system voltage lines 7 and 8.

The first inverter IN1 is provided with three sets of a series circuit (leg) where a positive electrode side switching device Q11 (upper arm) connected to the positive electrode side system voltage line 7 and a negative electrode side switching device Q12 (lower arm) connected to the negative electrode side system voltage line 8 were connected in series, corresponding to each phase of the three-phase windings. That is to say, the first inverter IN1 is provided with a total of six switching devices of the three positive electrode side switching devices Q11U, Q11V, Q11W, and the three negative electrode side switching devices Q12U, Q12V, Q12W. Each of free wheel diodes D11U, D11V, D11W, D12U, D12V, D12W is connected in inverse parallel with each of the switching devices Q11U, Q11V, Q11W, Q12U, Q12V, Q12W, respectively. Then, a connection node between the positive electrode side switching device Q11 and the negative electrode side switching device Q12 of each phase is connected to the winding of the corresponding phase in the first rotary electric machine MG1. A current sensor 27 for detecting a current which flows into the winding of each phase is provided on a wire of each phase which connects the connection node of a switching devices and the winding. An output signal of the current sensor 27 is inputted to the controller 400. Each of the switching devices Q11U, Q11V, Q11W, Q12U, Q12V, Q12W is controlled on/off by each of first inverter control signals S11, S12, S13, S14, S15, S16 outputted from the controller 400, respectively.

In the similar manner, the second inverter IN2 is provided with three sets of a series circuit (leg) where a positive electrode side switching device Q21 (upper arm) connected to the positive electrode side system voltage line 7 and a negative electrode side switching device Q22 (lower arm) connected to the negative electrode side system voltage line 8 were connected in series, corresponding to each phase of the three-phase windings. That is to say, the second inverter IN2 is provided with a total of six switching devices of the three positive electrode side switching devices Q21U, Q21V, Q21W, and the three negative electrode side switching devices Q22U, Q22V, Q22W. Each of the free wheel diodes D21U, D21V, D21W, D22U, D22V, D22W is connected in inverse parallel with each of the switching devices Q21U, Q21V, Q21W, Q22U, Q22V, Q22W, respectively. Then, a connection node between the positive electrode side switching device Q21 and the negative electrode side switching device Q22 of each phase is connected to the winding of the corresponding phase in the second rotary electric machine MG2. A current sensor 27 for detecting a current which flows into the winding of each phase is provided on a wire of each phase which connects the connection node of a switching devices and the winding. An output signal of the current sensor 27 is inputted to the controller 400. Each of the switching devices Q21U, Q21V, Q21W, Q22U, Q22V, Q22W is controlled on/off by each of second inverter control signals S21, S22, S23, S24, S25, S26 outputted from the controller 400, respectively.

By the switching control of the controller 400, the inverter IN1, IN2 can convert DC voltage of the system voltage lines 7, 8 into three-phase AC voltages, output to the rotary electric machine MG1, MG2, and can operate the rotary electric machine MG1, MG2 as the electric motor, respectively. By the switching control of the controller 400, the inverter IN1, IN2 can convert three-phase AC voltages, which the rotary electric machine MG1, MG2 generated, into DC voltage, and output to the system voltage lines 7, 8, respectively.

As the switching devices of the converter 15 and the inverter IN1, IN2, IGBTs (Insulated Gate Bipolar Transistor), MOS (Metal Oxide Semiconductor) transistors for power, bipolar transistors for power, SiC, GaN, or the like are used.

1-5. Controller

The controller 400 is provided with functional parts of a converter control unit 750, a converter voltage command calculation unit 700, an inverter control unit 600, and the like, mentioned below. Each function of the controller 400 is realized by processing circuits provided in the controller 400. In the present embodiment, as shown in FIG. 20, the controller 400 is provided with, as a processing circuit, an arithmetic processor (computer) 90 such as a CPU (Central Processing Unit), storage apparatuses 91 that exchange data with the arithmetic processor 90, an input circuit 92 that inputs external signals to the arithmetic processor 90, an output circuit 93 that outputs signals from the arithmetic processor 90 to the outside, and the like.

As the arithmetic processor 90, ASIC (Application Specific Integrated Circuit), IC (Integrated Circuit), DSP (Digital Signal Processor), FPGA (Field Programmable Gate Array), various kinds of logical circuits, various kinds of signal processing circuits, and the like may be provided. As the arithmetic processor 90, a plurality of the same type ones or the different type ones may be provided, and each processing may be shared and executed. As the storage apparatuses 91, there are provided a RAM (Random Access Memory) which can read data and write data from the arithmetic processor 90, a ROM (Read Only Memory) which can read data from the arithmetic processor 90, and the like. The input circuit 92 is connected with various kinds of sensors and switches such as the power source voltage sensor 10, the system voltage sensor 13, and the current sensor 27, the rotational angle sensor 28, and is provided with A/D converter and the like for inputting output signals from the sensors and the switches to the arithmetic processor 90. The output circuit 93 is connected with electric loads such as a gate drive circuit which drive on and off of the switching devices of the converter 15 and the switching devices of the inverters IN1, IN2, and is provided with driving circuit and the like for outputting a control signal from the arithmetic processor 90.

Then, the arithmetic processor 90 runs software items (programs) stored in the storage apparatus 91 such as a ROM and collaborates with other hardware devices in the controller 400, such as the storage apparatus 91, the input circuit 92, and the output circuit 93, so that the each function of the control units 750, 700, 600 provided in the controller 400 are realized. Setting data items such as map data be utilized in the control units 750, 700, 600 are stored, as part of software items (programs), in the storage apparatus 91 such as a ROM. Each function of the controller 400 will be described in detail below.

1-5-1. Inverter Control Unit 600

The inverter control unit 600 calculates three-phase voltage command values Vu, Vv, Vw, and controls the inverter IN based on the three-phase voltage command values Vu, Vv, Vw to apply voltage to the three-phase windings. The inverter control unit 600 controls on/off of the switching devices of the inverter IN so that the rotary electric machine MG outputs torque of a torque command value Tqcom. Torque command value Tqcom is transmitted from an external controller of the controller 400, or other control units inside the controller 400. In the present embodiment, the inverter control unit 600 performs current feedback control using a vector control method.

The inverter control unit 600 switches and performs a normal modulation control in which the amplitudes of the three-phase voltage command values Vu, Vv, Vw become less than or equal to a half value of the system voltage VH, and an overmodulation control in which the amplitudes of the three-phase voltage command values Vu, Vv, Vw exceed the half value of the system voltage VH.

In the present embodiment, the inverter control unit 600 is provided with a first inverter control unit 600a which performs control of the first inverter IN1 and the first rotary electric machine MG1, and a second inverter control unit 600b which performs control of the second inverter IN2 and the second rotary electric machine MG2.

Each of the first and the second torque command value Tqcom1, Tqcom2 is set to positive value or negative value according to driving condition. Especially at the time of regenerative braking of the hybrid vehicle, the second torque command value Tqcom2 is set to a negative value (Tqcom2<0). In this case, by the switching operation responded to the second inverter control signal S21 to S26, the second inverter IN2 converts the AC voltage, which the second rotary electric machine MG2 generated, into DC voltage, and supplies DC voltage (the system voltage VH) to the converter 15.

Since the first inverter control unit 600a and the second inverter control unit 600b are similar configurations, in the following description, the first inverter control unit 600a is explained as a representative.

Figure 3:
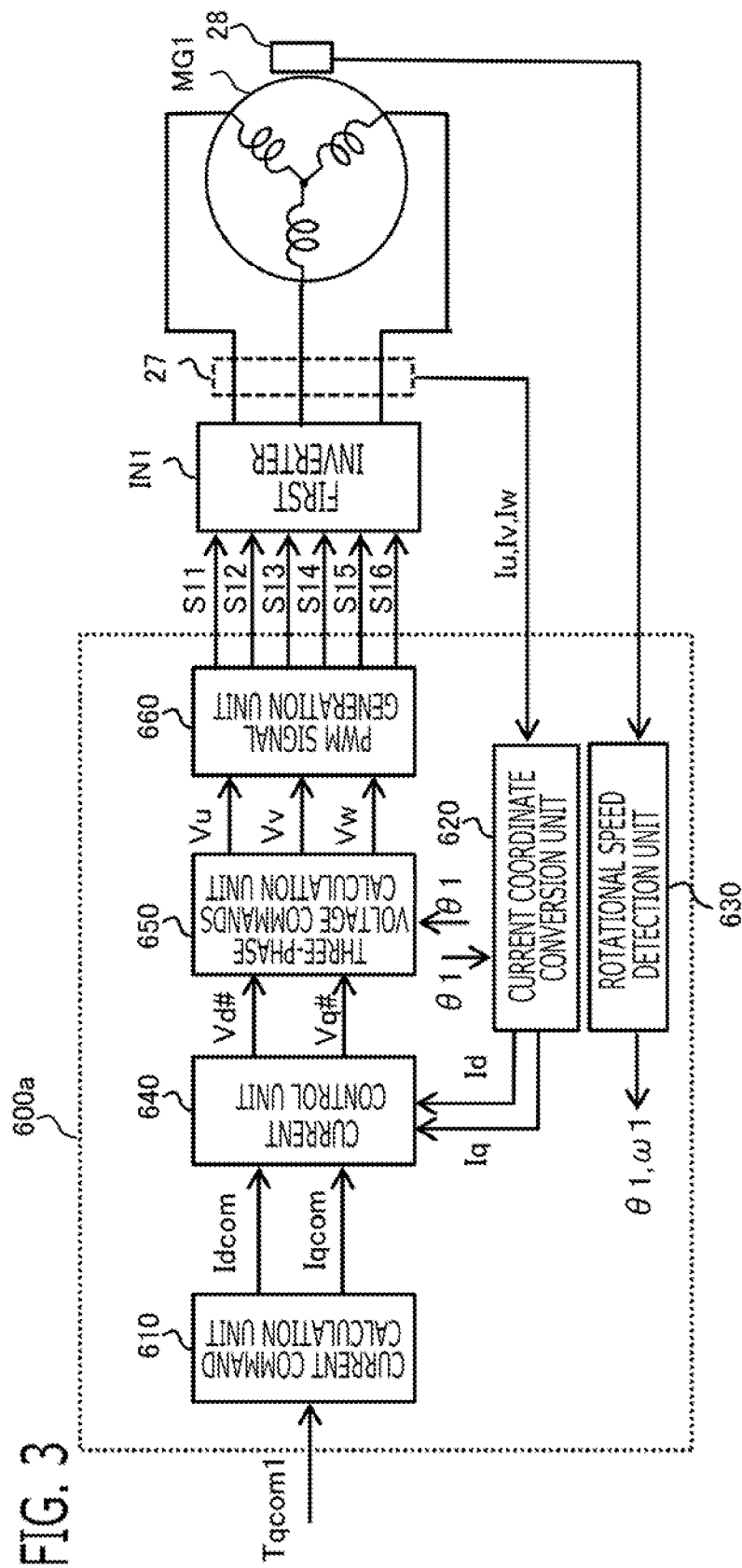
FIG. 3 is a block diagram of the inverter control unit according to Embodiment 1.

As shown in FIG. 3, the first inverter control unit 600a is provided with a current command calculation unit 610, a current control unit 640, a three-phase voltage commands calculation unit 650, a PWM signal generation unit 660, a current coordinate conversion unit 620, and a rotational angle speed detection unit 630.

1-5-1-1. Rotational Speed Detection Unit 630

The rotational speed detection unit 630 detects a rotational angle θ1 (a magnetic pole position) and a rotational angle speed ω1 of the rotor of the first rotary electric machine MG1, based on the output signal of the rotational angle sensor 28 of the first rotary electric machine MG1.

1-5-1-2. Current Command Calculation Unit 610

<Calculation of dq-Axis Current Command Values>

The current command calculation unit 610 calculates a d-axis current command value Idcom and a q-axis current command value Iqcom which expressed command values of the current which flows into the three-phase windings of the first rotary electric machine MG1 with the dq-axis rotating coordinate system of the first rotary electric machine MG1. The dq-axis rotating system consists of a d-axis defined in the direction of the N pole (magnetic pole position) of the permanent magnet provided in the rotor of the first rotary electric machine MG1 and a q-axis defined in the direction advanced to d-axis by 90 degrees ($\pi/2$) in an electrical angle, and which is the two-axis rotating coordinate system which rotates synchronizing with rotation of the rotor in the electrical angle.

<Maximum Torque/Current Control, Field Weakening Control>

The current command calculation unit 610 calculates the d-axis current command value Idcom and the q-axis current command value Iqcom which makes the first rotary electric machine MG1 output a torque of the first torque command value Tqcom1. The current command calculation unit 610 calculates the dq-axis current command values Idcom, Iqcom in accordance with the current vector control method of a maximum torque/current control, a field weakening control and the like. In the maximum torque/current control, the dq-axis current command values Idcom, Iqcom which maximize the generated torque for the same current are calculated. In the field weakening control, the d-axis current command value Idcom is made to increase in the negative direction rather than the dq-axis current command values Idcom, Iqcom calculated in the maximum torque/current control, and the magnetic flux of the permanent magnet is weakened. In the field weakening control, the dq-axis current command values Idcom, Iqcom are moved on a constant induced voltage ellipse (a voltage-limiting ellipse) according to the first torque command value Tqcom1.

The current command calculation unit 610 calculates the dq-axis current command values Idcom, Iqcom corresponding to the first torque command value Tqcom1, by use of a map data in which the relationship between the first torque command value Tqcom1 and the dq-axis current command values Idcom, Iqcom is preliminarily set for each control method.

The current command calculation unit 610 calculates the dq-axis current command values by the maximum torque/current control under the operating condition which can perform the maximum torque/current control; and calculates the dq-axis current command values by the field weakening control under the operating condition which cannot perform the calculation of the dq-axis current command values by the maximum torque/current control owing to limitation of the voltage-limiting ellipse.

1-5-1-3. Current Coordinate Conversion Unit 620

The current coordinate conversion unit 620 converts three-phase currents Iu, Iv, Iw, which flow into the winding of each phase detected based on the output signal of the current sensor 27 of the first rotary electric machine MG1, into a d-axis current Id and a q-axis current Iq represented in the dq axial rotation coordinate system by performing a three-phase/two-phase conversion and a rotating coordinate conversion based on the magnetic pole position θ1.

1-5-1-4. Current Control Unit 640

The current control unit 640 performs a current feedback control which changes, by PI control and the like, a d-axis voltage command value Vd # and a q-axis voltage command value Vg # which represent a command signal of the voltage applied to the first rotary electric machine MG1 in the dq-axis rotating coordinate system, so that the dq-axis currents Id, Iq approach the dq-axis current command values Idcom, Iqcom.

1-5-1-5. Three-Phase Voltage Commands Calculation Unit 650

<Coordinate Conversion>

Then, the three-phase voltage commands calculation unit 650 converts the dq-axis voltage command values Vd #, Vq # into three-phase AC voltage command values Vuc, Vvc, Vwc after coordinate conversion, by performing a fixed coordinate conversion and a two-phase/three-phase conversion based on the magnetic pole position θ1. These three-phase voltage command values Vuc, Vvc, Vwc after coordinate conversion become sine waves, and correspond to the fundamental wave components of the three-phase voltage command values or the applied voltages of the three-phase windings.

<Amplitude Reduction Modulation>

The three-phase voltage commands calculation unit 650 calculates final three-phase voltage command values Vu, Vv, Vw by applying an amplitude reduction modulation to the three-phase voltage command values Vuc, Vvc, Vwc after the coordinate conversion of sine waves. At least when a modulation rate M of the three-phase voltage command values after coordinate conversion becomes larger than 1, the three-phase voltage commands calculation unit 650 applies the amplitude reduction modulation, which reduces amplitudes of the three-phase voltage command values while maintaining line voltages of the three-phase voltage command values, to the three-phase voltage command values after coordinate conversion.

The modulation rate M of the three-phase voltage command values is a ratio of an amplitude VA of the fundamental wave component of the three-phase voltage command values or the applied voltages of the three-phase windings, with respect to the half value of the system voltage VH, as shown in a next equation. The fundamental wave components of the three-phase voltage command values become the same as the three-phase voltage command values after coordinate conversion.

$$M = VA \times 2/VH \quad (1)$$

<Normal Modulation Control or Overmodulation Control>

As explained below, since the amplitude reduction modulation is performed in the present embodiment, when the modulation rate M is less than or equal to 1.15, it becomes the state where the normal modulation control is performed, and when the modulation rate M is larger than 1.15, it becomes the state where the overmodulation control is performed.

1) When M<=1.15

The state where the normal modulation control is performed

2) When M>1.15

The state where the overmodulation control is performed

<The State where the Normal Modulation Control is Performed (M<=1)>

When the modulation rate M is less than or equal to 1, even if the modulation is not applied, the voltage saturation in which the amplitudes of the three-phase voltage command values after coordinate conversion exceed the half value of the system voltage VH does not occur, but it becomes the state where the normal modulation control is performed.

As shown in FIG. 4, in the state where the normal modulation control of M<=1 is performed, the voltage command value of the sine wave does not exceed the vibration range of the carrier wave (−VH/2 to VH/2) described below, but the switching signal is turned on and off with the duty ratio according to the voltage command value.

<The State where the Normal Modulation Control Due to the Amplitude Reduction Modulation is Performed (1<M<=1.15)>

In the case where the amplitude reduction modulation is not applied, when the modulation rate M becomes larger than 1, the voltage saturation in which the amplitudes of the three-phase voltage command values after coordinate conversion exceed the half value of the system voltage VH occurs, and it becomes the state where the overmodulation control is performed.

On the other hand, by applying the amplitude reduction modulation, until the modulation rate M becomes larger than 2/√3 (≈1.15), the voltage saturation in which the amplitudes of the three-phase voltage command values after amplitude reduction modulation exceed the half value of the system voltage VH does not occur, and it becomes the state where the normal modulation control is performed. Various well-known methods, such as third-order harmonic wave superimposing, the min-max method (pseudo third-order harmonic wave superimposing), two-phase modulation, and trapezoidal wave modulation, are used for the method of the amplitude reduction modulation. The third-order harmonic wave superimposing is the method that superimposes a third-order harmonic wave on the three-phase voltage command values after coordinate conversion. The min-max method is the method that superimposes ½ of a middle voltage of the three-phase voltage command values after coordinate conversion on the three-phase voltage command values after coordinate conversion. The two-phase modulation is the method that fixes any one phase of the voltage command values to 0 or the system voltage VH, and modulates other two phases so that line voltage of the three-phase voltage command values after coordinate conversion do not change.

As shown in FIG. 5, in the state of <M<=1.1.5 where the normal modulation control by the amplitude reduction modulation is performed, by the amplitude reduction modulation (in this example, the min-max method), the voltage command values are reduced so as not to exceed the vibration range of the carrier wave (−VH/2 to VH/2), and the switching signal is turned on and off with the duty ratio according to the voltage command value.

<The State where the Overmodulation Control is Performed (1.15<M<=1.27)>

On the other hand, when the modulation rate M becomes larger than 2/√3 (≈1.15), even if the amplitude reduction modulation is performed, the voltage saturation in which the amplitudes of three-phase voltage command values exceed the half value of the system voltage VH occurs, and it becomes the state where the overmodulation control is performed. The modulation rate M can be increased up to the maximum value 4/π (≈1.27) at which the voltage command value becomes a rectangular wave. When the modulation rate M is increased to 1.27, the three-phase voltage command values become rectangular waves, harmonic wave components become large and torque ripple components increase. Therefore, in the present embodiment, in order to suppress increase in the torque ripple components, the maximum set value of the modulation rate M is set to a value lower than 1.27, for example, 1.21.

As shown in FIG. 6, in the state of 1.15<M<=1.27 where the overmodulation control is performed, in interval when the voltage command value exceeds over the vibration range of the carrier wave (−VH/2 to VH/2) and the voltage saturation occurs, the switching signal is not turned on and off with the duty ratio according to the voltage command value, but it remains turned on or turned off. Therefore, in the overmodulation control, the number of turning the switching device on and off becomes less than the normal modulation control, and switching loss is reduced.

1-5-1-6. PWM Signal Generation Unit 660

The PWM signal generation unit 660 turns on and off the plurality of switching devices by PWM (Pulse Width Modulation) control based on the three-phase voltage command values Vu, Vv, Vw. The PWM signal generation unit 660 generates switching signals which turn on and off the switching devices of each phase, by comparing each of the three-phase voltage command values and the carrier wave. The carrier wave is a triangular wave which vibrates with an amplitude of ½ of the system voltage VH centering on 0 with a carrier frequency. The PWM signal generation unit 660 turns on the switching signal when the voltage command value exceeds the carrier wave, and turns off the switching signal when the voltage command value is below the carrier wave. The switching signal is transmitted as it is to the positive electrode side switching device, and a switching signal which reversed the switching signal is transmitted to the negative electrode side switching device. Each switching signal S11 to S16 is inputted into the gate terminal of each switching device of the first inverter IN1 via the gate drive circuit, and each switching device is turned on or turned off.

1-5-2. Converter Control Unit 750

The converter control unit 750 controls the converter 15 so that the system voltage VH which is the DC voltage of the system voltage lines 7, 8 approaches a converter voltage command value VH #, when the converter voltage command value VH # is larger than the power source voltage Vb. In the present embodiment, the converter control unit 750 detects the power source voltage Vb based on an output signal of the power source voltage sensor 10, and detects the system voltage VH based on an output signal of the system voltage sensor 13. The converter control unit 750 changes the duty ratio of the converter control signals S1 to S2 according to a PWM control method based on the system voltage VH and the converter voltage command value VH #.

When performing a voltage boosting operation to the converter 15, for example the converter control unit 750 sets alternately the ON period which turns on only the positive electrode side switching device Q1 and the ON period which turns on only the negative electrode side switching device Q2, and changes the ratio of the two ON periods to change a voltage boosting ratio. When performing a voltage dropping operation to the converter 15, for example the converter control unit 750 sets alternately the ON period which turns on only the positive electrode side switching device Q1 and the OFF period which turns off all the switching devices Q1, Q2, and changes the ratio of the ON period and the OFF period to change a voltage dropping ratio. When the converter voltage command value VH # is smaller than or equal to the power source voltage Vb, the converter control unit 750 turns off all the switching devices Q1, Q2, and changes the direct current power source B and the system voltage lines 7, 8 into the direct connection state.

At the time of the voltage boosting operation, the converter 15 supplies the system voltage VH, which boosted the power source voltage Vb supplied from the direct current power source B, to the inverter IN1, IN2 in common. At the time of the voltage dropping operation, the converter 15 drops the system voltage VH supplied from the inverter IN1, IN2 via the smoothing capacitor C0, and supplies it to the direct current power source B.

1-5-3. Converter Voltage Command Calculation Unit 700

The converter voltage command calculation unit 700 calculates the converter voltage command value VH # within a range which is larger than or equal to the power source voltage Vb and is smaller than or equal to the output upper limit voltage Vcnmax of the converter. In the present embodiment, as shown in FIG. 7, the converter voltage command calculation unit 700 is provided with a border voltage calculation unit 800, a motor output calculation unit 801, a loss characteristic calculation unit 802, and a voltage command calculation unit 803.

1-5-3-1. Border Voltage Calculation Unit 800

Since a counter electromotive force of the rotary electric machine MG increases and an induced voltage becomes high when the rotational angle speed w and torque increase, a border voltage Vmg which is the minimum system voltage VH required in the case of performing the normal modulation control becomes high. In order to perform the normal modulation control, it is necessary to make the system voltage VH higher than the border voltage Vmg. On the other hand, there is a limit in the voltage boosting of the converter 15, and there is an upper limit value (the output upper limit voltage Vcnmax) in the output voltage (system voltage VH) of the converter 15.

The border voltage calculation unit 800 calculates the border voltage Vmg which is the minimum system voltage VH required in the case of performing the normal modulation control under conditions of the present torque command value Tqcom and the present rotational angle speed ω of the rotary electric machine MG.

Figure 8:
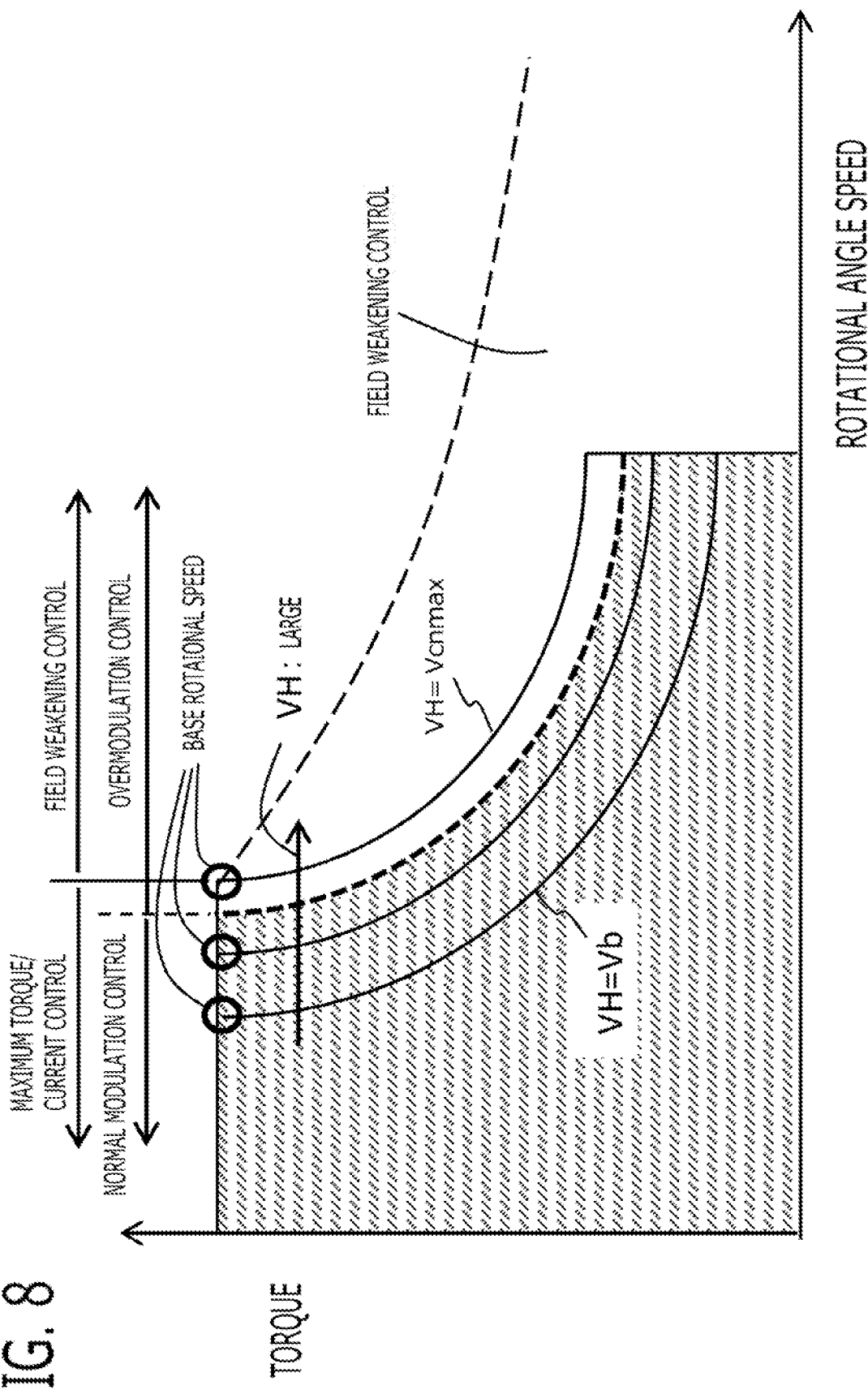
FIG. 8 is a figure for explaining each control region according to Embodiment 1.

In the present embodiment, the maximum torque current control is performed in performing the normal modulation control. FIG. 8 shows a torque-rotational angle speed characteristics for explaining an executable region of the maximum torque/current control. A vertical axis is the torque of the rotary electric machine MG, a horizontal axis is the rotational angle speed ω of the rotary electric machine MG, and the solid line in the figure shows a maximum torque line at each rotational angle speed a in the case of performing the maximum torque/current control. In the case where the rotational angle speed ω is smaller than or equal to a base rotational angle speed, the maximum output torque of the rotary electric machine MG is determined by restricting the current of the rotary electric machine MG to a rated current, and becomes a constant value to a change of the rotational angle speed ω. In the case where the rotational angle speed ω is larger than the base rotational angle speed, the maximum output torque of the rotary electric machine MG is determined by restricting a line voltage of the rotary electric machine MG to the system voltage VH, and decreases as the rotational angle speed ω increases.

A plurality of solid line curves of FIG. 8 show a change of the maximum torque line of the maximum torque/current control when changing the system voltage VH. As shown in FIG. 8, as the system voltage VH is boosted from the power source voltage Vb to the output upper limit voltage Vcnmax, the maximum torque line and the base rotational speed can be shifted to the high rotational angle speed side, and the executable region of the maximum torque/current control can be expanded. In the case where the system voltage VH is the output upper limit voltage Vcnmax, the base rotational angle speed becomes the highest and the executable region of the maximum torque/current control becomes the widest.

A region of high rotation angular speed side and high torque side rather than the executable region of the maximum torque/current control corresponding to this output upper limit voltage Vcnmax is an executable region of the field weakening control when the system voltage VH is the output upper limit voltage Vcnmax.

In the present embodiment, the maximum torque/current control is performed even in a part of the execution region of the overmodulation control where the modulation rate M is larger than 1.15 (for example, 1.15<M<=1.21). As shown in FIG. 8 by hatching, the execution region of the normal modulation control is a region where the modulation rate M becomes less than or equal to 1.15 in the executable region of the maximum torque/current control. Therefore, in the case where the modulation rate M is increased to the modulation rate M of the boundary between the normal modulation control and the overmodulation control (in this example, M=1.15), the border voltage Vmg is the minimum system voltage VH required in the case of performing the maximum torque/current control. A region where the system voltage VH is less than or equal to the border voltage Vmg is the executable region of the normal modulation control, and a region where the system voltage VH is larger than the border voltage Vmg is the executable region of overmodulation control.

Figure 9:
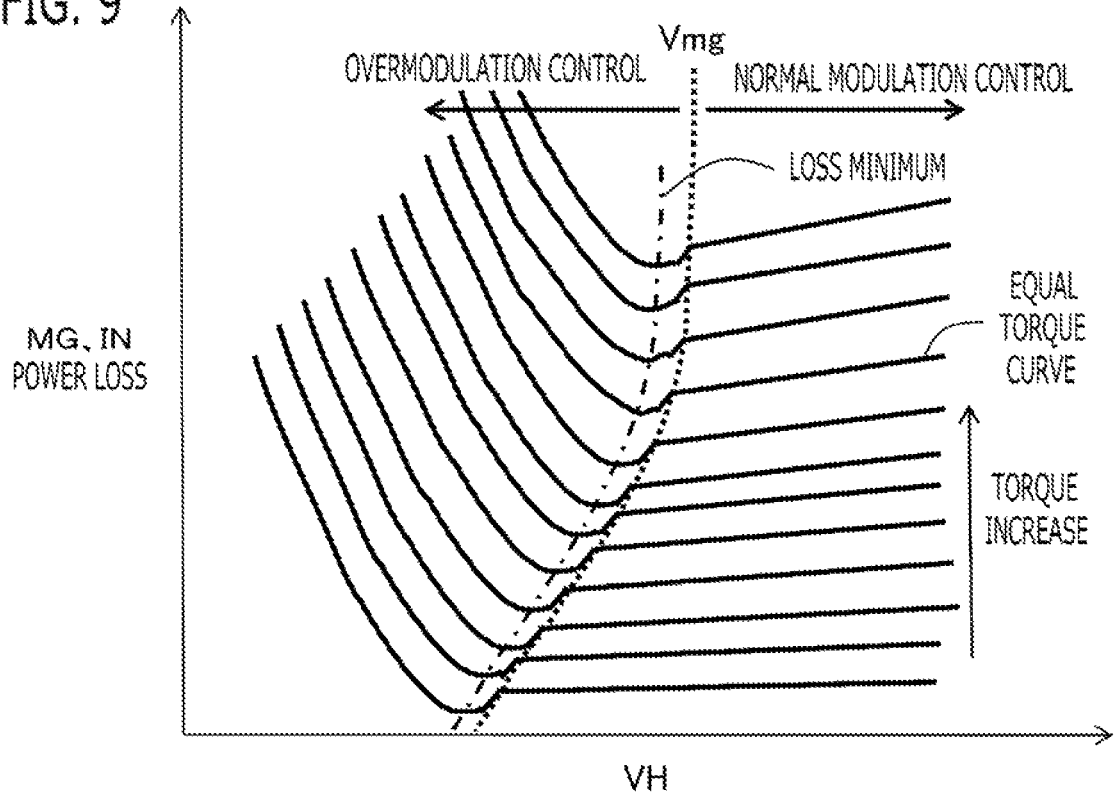
FIG. 9 is a figure for explaining the power loss characteristics of the inverter and the rotary electric machine according to Embodiment 1.

FIG. 9 is a figure which plotted equal torque curves of each torque at a certain rotational angle speed, in the case where a vertical axis is a power loss of the inverter IN and the rotary electric machine MG, and a horizontal axis is the system voltage VH. Since a large motor current is generally necessary in order to generate a large torque, a loss becomes large accordingly. A dotted line in FIG. 9 shows the line of the border voltage Vmg where the execution region of the normal modulation control and the execution region of the overmodulation control switch. As seen from FIG. 9, in each equal torque curve, the power loss of the inverter IN and the rotary electric machine MG becomes the minimum in the line shown by the dashed dotted line which is little lower than the line of the border voltage Vmg.

As the system voltage VH is reduced rather than the line of the minimum power loss, the power loss of the inverter IN and the rotary electric machine MG increases gradually. In order to maintain the output torque against the drop of the system voltage VH, it is necessary to lower the induced voltage. For that purpose, the d-axis current is increased to the negative direction, and the magnetic flux of the permanent magnet is weakened. As a result, as the system voltage VH is lowered, the winding current increases, and the energization loss of the inverter IN and the copper loss of the rotary electric machine MG increase.

<Detailed Configuration of the Border Voltage Calculation Unit 800>

The detailed configuration of the border voltage calculation unit 800 will be explained. The border voltage calculation unit 800, about the first rotary electric machine MG, calculates the first border voltage Vmg1 which is the minimum system voltage VH required in the case of performing the normal modulation control of the first rotary electric machine MG1 under the conditions of the present torque command value Tqcom1 and the present rotational angle speed $\omega 1$ of the first rotary electric machine MG1. The border voltage calculation unit 800, about the second rotary electric machine MG2, calculates the second border voltage Vmg2 which is the minimum system voltage VH required in the case of performing the normal modulation control of the second rotary electric machine MG2 under the conditions of the present torque command value Tqcom2 and the present rotational angle speed $\omega 2$ of the second rotary electric machine MG2.

Figure 10:
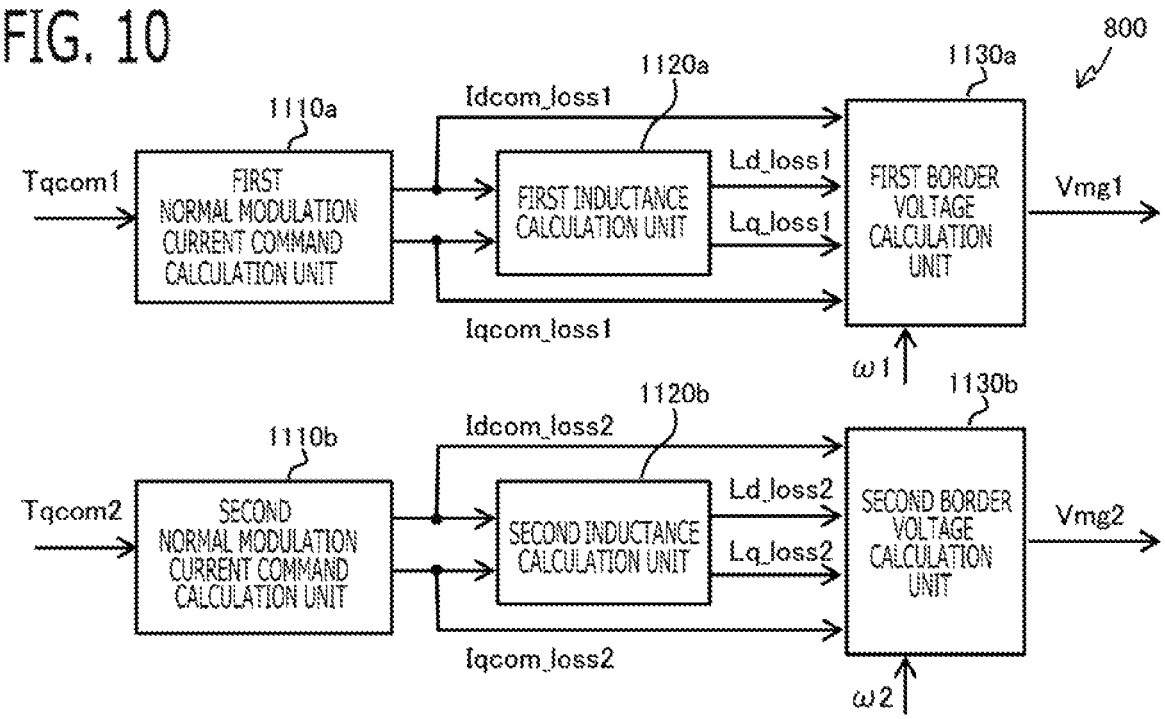
FIG. 10 is a block diagram of the border voltage calculation unit according to Embodiment 1.

In the present embodiment, as shown in FIG. 10, the border voltage calculation unit 800 is provided with a first normal modulation current command calculation unit 1110a, a second normal modulation current command calculation unit 1110b, a first inductance calculation unit 1120a, a second inductance calculation unit 1120b, a first border voltage calculation unit 1130a, and a second border voltage calculation unit 1130b.

The first normal modulation current command calculation unit 1110a calculates first normal modulation dq-axis current command values Idcom_loss1, Iqcom_loss1 which make the first rotary electric machine MG1 output the first torque command value Tqcom1 by performing the normal modulation control and the maximum torque/current control. The first normal modulation current command calculation unit 1110a calculates the dq-axis current command values by the similar method as the current command calculation unit 610 of the first inverter control unit 600a.

In the present embodiment, the first normal modulation current command calculation unit 1110a calculates the first normal modulation dq-axis current command values Idcom_loss1, Iqcon_loss1 on a fixed operating condition of a preliminarily set rotational angle speed (for example, $\omega 1=0$) smaller than or equal to the base rotational speed. According to this configuration, even if the present operating condition is the execution region of the overmodulation control, the current command values for the normal modulation control can be calculated certainly.

The first normal modulation current command calculation unit 1110a calculates the first normal modulation dq-axis current command values Idcom_loss1, Iqcom_loss1 corresponding to the first torque command value Tqcom1, by using a map data in which the relationship between the first torque command value Tqcom1 and the first normal modulation dq-axis current command values Idcom_loss1, Iqcom_ loss1 is preliminarily set. The map data is preliminarily set based on measured value or magnetic field analysis. The q-axis current command value and d-axis current command value corresponding to the each torque command value are set to the map data at the interval (unit) of predetermined torque command value.

The first inductance calculation unit 1120a calculates first dq-axis inductances Ld_loss1, Lq_loss1 of the first rotary electric machine MG1 corresponding to the first normal modulation dq-axis current command values Idcom_loss1, Iqcom_loss1. The first inductance calculation unit 1120a calculates the first dq-axis inductances Ld_loss1, Lq_loss1 corresponding to the first normal modulation dq-axis current command values Idcom_loss1, Iqcom_loss1, by using a map data in which the relationship between the first normal modulation dq-axis current command values Idcom_loss1, Iqcom_loss1 and the first dq-axis inductances Ld_loss1, Lq_loss1 is preliminarily set.

The first border voltage calculation unit 1130a calculates the first border voltage Vmg1 using a next equation, based on the first normal modulation dq-axis current command values Idcont_loss1, Iqcont_loss1, the first dq-axis inductances Ld_loss1, Lq_loss1, and the rotational angle speed a1 of the first rotary electric machine MG1.

$$Vmg1 = \frac{M_{max}}{\eta 1} \sqrt{\begin{array}{l}(R1 \cdot \text{Idcom\_loss1} - \omega 1 \cdot \text{Lq\_loss1} \cdot \text{Iqcom\_loss1})^2 + \\ (R1 \cdot \text{Idcom\_loss1} + \omega 1 \cdot \text{Ld\_loss1} \cdot \\ \text{Idcom\_loss1} + \omega 1 \cdot \varphi mag1)^2 \end{array}} \quad (2)$$

Herein, Mmax is the maximum value of the modulation rate M of the execution region of the normal modulation control (in this example, 1.15). η1 expresses a ratio which converts the system voltage VH into the line voltage of the first rotary electric machine MG1. Therefore, the equation (2) calculates, by calculation of the square root, the minimum line voltage of the first rotary electric machine MG1 required in the case of performing the normal modulation control and the maximum torque/current control of the first rotary electric machine MG1, and converts the line voltage into the system voltage using η1. R1 is the resistance of the winding of the stator of the first rotary electric machine MG1, and ψmag1 is the magnetic flux of the permanent magnet of the rotor of the first rotary electric machine MG1.

By the similar method as the first normal modulation current command calculation unit 1110a, the second normal modulation current command calculation unit 1110b calculates second normal modulation dq-axis current command values Idcom_loss2, Iqcom_loss2 which make the second rotary electric machine MG2 output the second torque command value Tqcom2 by performing the normal modulation control and the maximum torque/current control.

By the similar method as the first inductances calculation unit 1120a, the second inductances calculation unit 1120b calculates second dq-axis inductances Ld_loss2, Lq_loss2 of the second rotary electric machines MG2 corresponding to the second normal modulation dq-axis current command values Idcom_loss2, Iqcom_loss2.

The second border voltage calculation unit 1130b calculates the second border voltage Vmg2 using a next equation, based on the second normal modulation dq-axis current command values Idcom_loss2, Iqcom_loss2, the second dq-axis inductances Ld_loss2, Lq_loss2, and the rotational angle speed ω2 of the second rotary electric machine MG2.

$$Vmg2 = \frac{M_{max}}{\eta 2} \sqrt{\begin{array}{l}(R2 \cdot \text{Idcom\_loss2} - \omega 2 \cdot \text{Lq\_loss2} \cdot \text{Iqcom\_loss2})^2 + \\ (R2 \cdot \text{Idcom\_loss2} + \omega 2 \cdot \text{Ld\_loss2} \cdot \\ \text{Idcom\_loss2} + \omega 2 \cdot \varphi mag2)^2 \end{array}} \quad (3)$$

η2 expresses a ratio which converts the system voltage VH into the line voltage of the second rotary electric machines MG2. R2 is the resistance of the winding of the stator of the second rotary electric machine MG2, and ψmag2 is the magnetic flux of the permanent magnet of the rotor of the second rotary electric machine MG2.

1-5-3-2. Motor Output Calculation Unit 801

As shown in FIG. 7, the converter voltage command calculation unit 700 is provided with the motor output calculation unit 801. The motor output calculation unit 801 calculates an output PMOT of the rotary electric machine MG by multiplying the torque command value Tqcom and the rotational angle speed ω. In the present embodiment, the motor output calculation unit 801 calculates an output PMOT_mg1 of the first rotary electric machine MG1 by multiplying the first torque command value Tqcom1 and the first rotational angle speed ω1. The motor output calculation unit 801 calculates an output PMOT_mg2 of the second rotary electric machine MG2 by multiplying the second torque command value Tqcom2 and the second rotational angle speed ω2. Then, the motor output calculation unit 801 calculates a sum total output PMOT_ALL of two rotary electric machines by totaling the output PMOT_mg1 of the first rotary electric machine MG1 and the output PMOT_mg2 of the second rotary electric machine MG2.

1-5-3-3. Loss Characteristic Calculation Unit 802

<Calculation of Power Loss Characteristics of Normal Modulation Control, and Power Loss Characteristics of Overmodulation Control>

Figure 11:
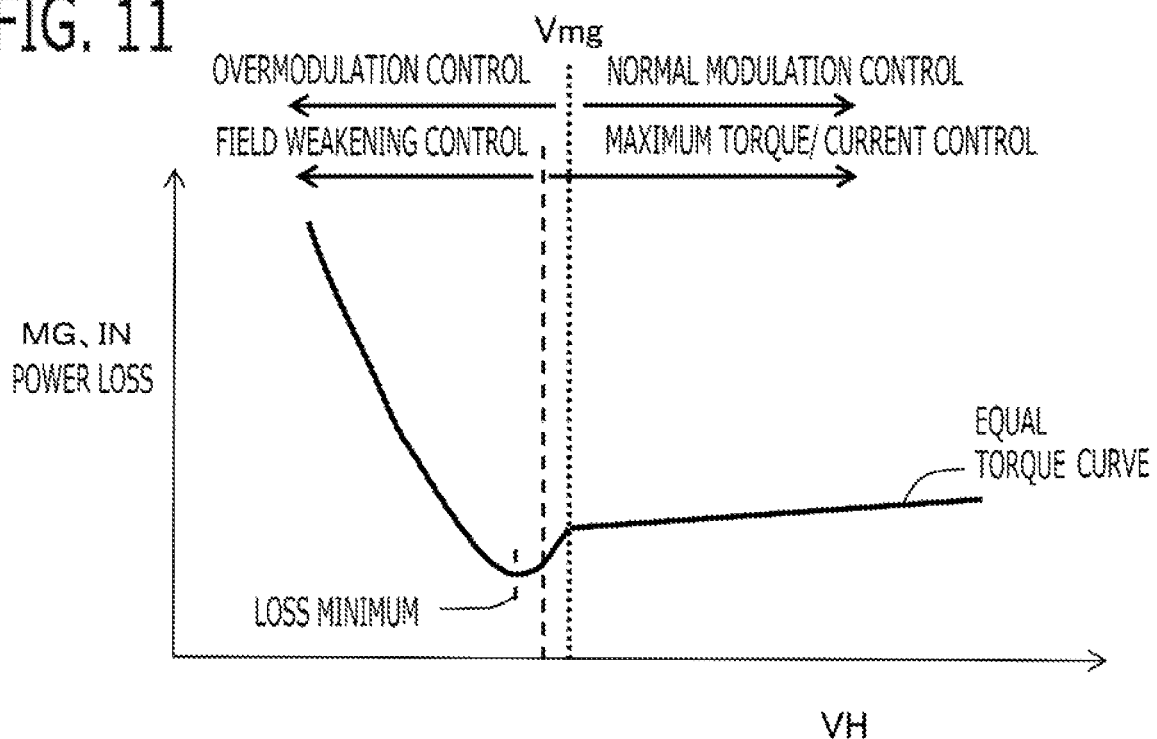
FIG. 11 is a figure for explaining the power loss characteristics of the inverter and the rotary electric machine according to Embodiment 1.

Similarly to FIG. 9, FIG. 11 is a figure which plotted an equal torque curve of a certain torque at a certain rotational angle speed, in the case where a vertical axis is a power loss of the inverter IN and the rotary electric machine MG and a horizontal axis is the system voltage VH. The trends of the power loss characteristics are different among the execution region of the normal modulation control and the maximum torque/current control, the execution region of the overmodulation control and the maximum torque/current control, and the execution region of the overmodulation control and the field weakening control.

In the execution region of the normal modulation control and the maximum torque/current control, as the system voltage VH decreases, the power loss decreases gradually at small gradient. In the execution region of the overmodulation control and the maximum torque/current control, as the system voltage VH decreases, the modulation rate M increases, the switching frequency of the switching device decreases, and the switching loss decreases. Therefore, the power loss decreases gradually at larger gradient than the execution region of the normal modulation control and the maximum torque/current control. In the execution region of the overmodulation control and the field weakening control, as the system voltage VH decreases, after the power loss decreases gradually for a while, the power loss increases gradually by increase in the copper loss and the energization loss.

Characteristics of the power loss are largely different between the execution region of the overmodulation control and the execution region of the normal modulation control. That is to say, combining the execution region of the overmodulation control and the maximum torque/current control, and the execution region of the overmodulation control and the field weakening control, the power lose can be approximated by a quadratic function of downwardly projected. In the execution region of normal modulation control, the power loss can be approximated by a linear function.

Then, the loss characteristic calculation unit 802 calculates a power loss characteristics of the normal modulation control which is a power loss characteristics of the rotary electric machine and the inverter with respect to the system voltage VH in performing the normal modulation control, and a power loss characteristics of the overmodulation control which is a power loss characteristics of the rotary electric machine and the inverter with respect to the system voltage VH in performing the overmodulation control. In the present embodiment, the loss characteristic calculation unit 802 calculates the power loss characteristics of the normal modulation control, and the power loss characteristics of the overmodulation control, about each of the first rotary electric machine MG1 and the second rotary electric machine MG2.

In the present embodiment, the loss characteristic calculation unit 802 calculates coefficients of the polynomial (in this example, 2nd-order polynomial) in which the system voltage VH is a variable, as the power loss characteristics of the normal modulation control and the power loss characteristics of the overmodulation control.

The polynomial representing each power loss characteristics is a 2nd-order polynomial showing in each of next equations. Herein, Ploss_mg1_1 is the power loss of the normal modulation control of the first rotary electric machine MG1, Ploss_mg1_2 is the power loss of the overmodulation control of the first rotary electric machine MG1, Ploss_mg2_1 is the power loss of the normal modulation control of the second rotary electric machine MG2, and Ploss_mg2_2 is the power loss of the overmodulation control of the second rotary electric machine MG2.

$$Ploss\_mg1\_1(VH)=\alpha\_mg1\_1 \cdot VH^2+\beta\_mg1\_1 \cdot VH+\gamma\_mg1\_1 \quad (4)$$

$$Ploss\_mg1\_2(VH)=\alpha\_mg1\_2 \cdot VH^2+\beta\_mg1\_2 \cdot VH+\gamma\_mg1\_2 \quad (5)$$

$$Ploss\_mg2\_1(VH)=\alpha\_mg2\_1 \cdot VH^2+\beta\_mg2\_1 \cdot VH+\gamma\_mg2\_1 \quad (6)$$

$$Ploss\_mg2\_2(VH)=\alpha\_mg2\_2 \cdot VH^2+\beta\_mg2\_2 \cdot VH+\gamma\_mg2\_2 \quad (7)$$

The loss characteristic calculation unit 802 calculates each order coefficient $\alpha$, $\beta$, and $\gamma$ of the polynomial of each power loss characteristics of the equation (4) to the equation (7). In the present embodiment, as shown in FIG. 12, about each order coefficient of each the power loss characteristics of the first rotary electric machine MG1, by use of a relation characteristic in which a relationship among the output torque of the first rotary electric machine MG1, the rotational angle speed ω1 of the first rotary electric machine MG1, and each coefficient is preliminarily set, the loss characteristic calculation unit 802 calculates each coefficient corresponding to the present torque command value Tqcom1 and the present rotational angle speed ω1 of the first rotary electric machine MG1. As shown in FIG. 13, about each order coefficient of each the power loss characteristics of the second rotary electric machine MG2, by use of a relation characteristic in which a relationship among the output torque of the second rotary electric machine MG2, the rotational angle speed ω2 of the second rotary electric machine MG2, and each coefficient is preliminarily set, the loss characteristic calculation unit 802 calculates each coefficient corresponding to the present torque command value Tqcom2 and the rotational angle speed ω2 of the second rotary electric machine MG2. Map data and the like is used for the relation characteristic. The relation characteristic of each coefficient is preliminarily set using the least square method, based on measured loss data, or loss data calculated by magnetic field analysis and loss calculation of the inverter at every torque of rotary electric machine and rotational angle speed of rotary electric machine, for example.

<Calculation of Power Loss Characteristics of Converter>

Figure 14:
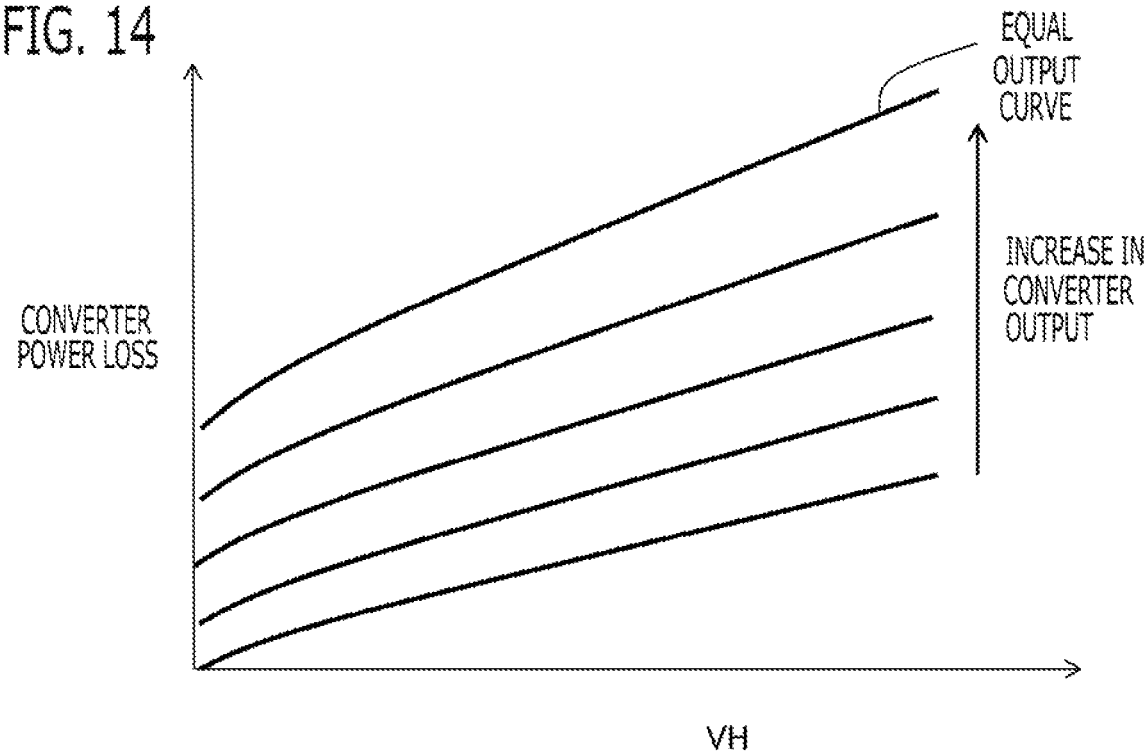
FIG. 14 is a figure for explaining the power loss characteristics of the converter according to Embodiment 1.

First, the power loss characteristics of the converter 15 will be explained. FIG. 14 shows the power loss characteristics of the converter 15. A horizontal axis is the system voltage VH and a vertical axis is the power loss of the converter 15. They are characteristics when the power source voltage Vb is fixed and the output of the converter is changed. Equal output curves at each output of the converter are plotted. At each output of the converter, as the system voltage VH increases, the power loss of the converter increases. At each system voltage VH, as the output of the converter increases, the power loss of the converter increases.

The loss characteristic calculation unit 802 calculates the power loss characteristics of the converter with respect to the system voltage VH. In the present embodiment, the loss characteristic calculation unit 802 calculates coefficients of the polynomial (in this example, a polynomial whose order is smaller than or equal to the 2nd-order) in which the system voltage VH is a variable, as the power loss characteristics of the converter.

The polynomial representing the power loss characteristics of the converter is a 2nd-order polynomial showing in a next equation. Ploss_dcdc is the power loss of the converter.

$$Ploss\_dcdc(VH)=\alpha\_dcdc \cdot VH^2+\beta\_dcdc \cdot VH+\gamma\_dcdc \quad (8)$$

Figure 15:
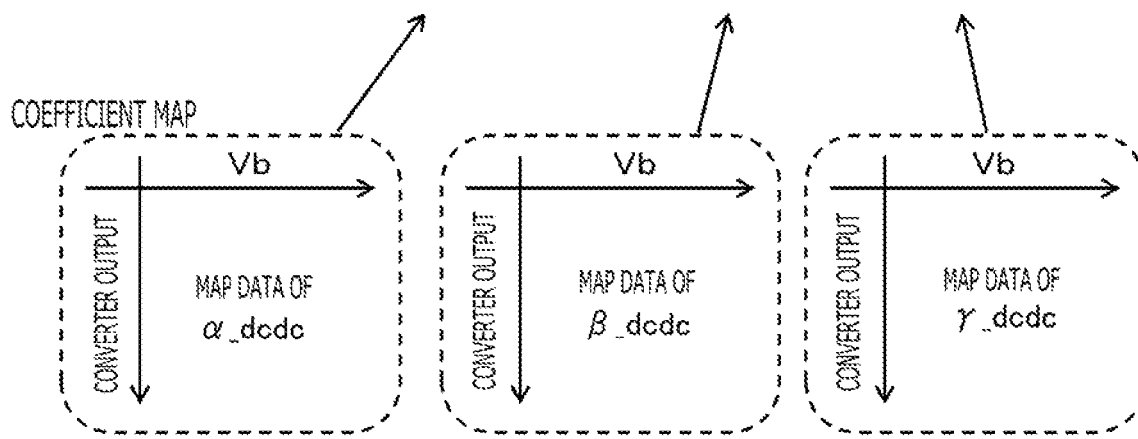
FIG. 15 is a figure for explaining the polynomial representing the power loss characteristic of the converter, and calculation of its coefficients according to Embodiment 1.

The loss characteristic calculation unit 802 calculates each order coefficient $\alpha$, $\beta$, and $\gamma$ of the polynomial of the power loss characteristics of the converter of the equation (8). In the present embodiment, as shown in FIG. 15, about each order coefficient of the power loss characteristics of the converter, by use of a relation characteristic in which a relationship between the power source voltage Vb and the output (output power) of the converter 15 is preliminarily set, the loss characteristic calculation unit 802 calculates each coefficient corresponding to the present power source voltage Vb and the present output of the converter 15. Map data and the like is used for the relation characteristic. The relation characteristic of each coefficient is preliminarily set using the least square method, based on measured loss data of the converter 15, or loss data calculated by loss calculation of the converter 15 at every the converter output and the power source voltage Vb, for example.

As mentioned above, each power loss characteristics are approximated by the 2nd-order polynomial in which the system voltage VH is the variable, and each order coefficient is calculated using the relation characteristic between two variables. Therefore, compared with the case where each power loss characteristics is not approximated by the polynomial, but is approximated by a relation characteristic of three variables which are the system voltage VH and two variables, combination can be reduced significantly and the storage capacity can be reduced significantly. The computation load in the voltage command calculation unit 803 described below can also be reduced significantly.

1-5-3-4. Voltage Command Calculation Unit 803

The voltage command calculation unit 803 sets the system voltage VH that a power loss becomes the minimum, as the converter voltage command value VH #, based on the power loss characteristics of the normal modulation control and the power loss characteristics of the overmodulation control.

According to this configuration, the power loss characteristics of the normal modulation control and the power loss characteristics of the overmodulation control, which are different in trend of characteristics, are calculated individually, and the converter voltage command value VH # that the power loss becomes the minimum can be determined with good accuracy based on two power loss characteristics.

In the present embodiment, the voltage command calculation unit 803 calculates a minimum value of the power loss in performing the normal modulation control, and the system voltage VH at the calculated minimum value of the power loss, based on the power loss characteristics of the normal modulation control; and calculates a minimum value of the power loss in performing the overmodulation control, and the system voltage VH at the calculated minimum value of the power loss, based on the power loss characteristics of the overmodulation control. Then, the voltage command calculation unit 803 determines any smaller one of the minimum value of the power loss in performing the normal modulation control, and the minimum value of the power loss in performing the overmodulation control, and sets the system voltage at the determined smaller one, as the converter voltage command value VH #.

According to this configuration, based on each power loss characteristics, the minimum value of the power loss in performing the normal modulation control and the minimum value of the power loss in performing the overmodulation control can be calculated with good accuracy, and the system voltage VH corresponding to the minimum value of the power loss of modulation control with smaller power loss can be set as the converter voltage command value VH #.

In the present embodiment, since a plurality of sets of the rotary electric machine MG and the inverter IN are provided, the voltage command calculation unit 803 sets the system voltage VH that a power loss obtained by totaling a plurality of sets becomes a minimum, as the converter voltage command value VH #, based on each set of the power loss characteristics of the normal modulation control and the power loss characteristics of the overmodulation control. The voltage command calculation unit 803 sets the system voltage VH that a sum total power loss of the rotary electric machine, the inverter, and the converter becomes a minimum, as the converter voltage command value VH #, based on the power loss characteristics of the normal modulation control, the power loss characteristics of the overmodulation control, and the power loss characteristics of the converter.

According to this configuration, even if a plurality of sets of the rotary electric machine MG and the inverter IN are provided, based on each set of the power loss characteristics of the normal modulation control and the power loss characteristics of the overmodulation control, the system voltage VH that the power loss obtained by totaling a plurality of sets becomes the minimum can be set as the converter voltage command value VH #.

About each of a plurality of combinations which combined the case where the normal modulation control or the overmodulation control is performed in each set, the voltage command calculation unit 803 calculates a minimum value of sum total power loss based on each set of the power loss characteristics of the normal modulation control or the power loss characteristics of the overmodulation control, and calculates the system voltage at the calculated minimum value as a candidate value VHtp of the converter voltage command value. Then, the voltage command calculation unit determines a combination that the minimum value of the power loss becomes the smallest in the plurality of combinations, and sets the candidate value VHtp of the converter voltage command value in the determined combination as the converter voltage command value VH #.

According to this configuration, about each combination, the minimum value of the sum total power loss of each combination can be calculated with good accuracy based on each set of the power loss characteristics of the normal modulation control or the power loss characteristics of overmodulation control corresponding to each combination. Then, the combination that sum total power loss becomes the minimum in the plurality of combinations is determined, and the candidate value VHtp of the converter voltage command value of the determined combination can be set as the converter voltage command value VH #.

About each of the plurality of combinations, the voltage command calculation unit 803 totals the coefficients of corresponding respective power loss characteristics for each order of the polynomials, and calculates the minimum value of sum total power loss, and the candidate value VHtp of the converter voltage command value corresponding to the minimum value of sum total power loss, based on the total value of each order coefficient.

According to this configuration, by calculating the total value of each order coefficient about the plurality of power loss characteristics of each combination, each value can be calculated using total power loss characteristics. Therefore, computation load can be significantly reduced rather than the case of calculating using each power loss characteristics individually.

In the present embodiment, since 2 sets of the rotary electric machine MG and the inverter IN are provided, the number of combination becomes 4. As follows, the first combination is set to the case where the normal modulation control is performed in both of the first rotary electric machine MG1 and the second rotary electric machine MG2. The second combination is set to the case where the overmodulation control is performed in both of the first rotary electric machine MG1 and the second rotary electric machine MG2. The third combination is set to the case where the normal modulation control is performed in the first rotary electric machine MG1 and the overmodulation control is performed in the second rotary electric machine MG2. The fourth combination is set to the case where the overmodulation control is performed in the first rotary electric machine MG1 and the normal modulation control is performed in the second rotary electric machine MG2.

Then, as shown in a next equation, about each combination, the voltage command calculation unit 803 calculates a 2nd-order total coefficient $\alpha\_all$ that totals the 2nd-order coefficients of corresponding respective power loss characteristics, calculates a 1st-order total coefficient $\beta\_all$ that totals the 1st-order coefficients of respective power loss characteristics, and calculates a 0-order total coefficient $\gamma\_all$ that totals the 0-order coefficients of respective power loss characteristics. Specifically, about the first combination, the voltage command calculation unit 803, for each order, totals the coefficient of the power loss characteristics of the normal modulation control of the first rotary electric machine MG1, the coefficient of the power loss characteristics of the normal modulation control of the second rotary electric machine MG2, and the coefficient of the power loss characteristics of the converter. About the second combination, the voltage command calculation unit 803, for each order, totals the coefficient of the power loss characteristics of the overmodulation control of the first rotary electric machine MG1, the coefficient of the power loss characteristics of the overmodulation control of the second rotary electric machine MG2, and the coefficient of the power loss characteristics of the converter. About the third combination, the voltage command calculation unit 803, for each order, totals the coefficient of the power loss characteristics of the normal modulation control of the first rotary electric machine MG1, the coefficient of the power loss characteristics of the overmodulation control of the second rotary electric machine MG2, and the coefficient of the power loss characteristics of the converter. About the fourth combination, the voltage command calculation unit 803, for each order, totals the coefficient of the power loss characteristics of the overmodulation control of the first rotary electric machine MG1, the coefficient of the power loss characteristics of the normal modulation control of the second rotary electric machine MG2, and the coefficient of the power loss characteristics of the converter.

1) First Combination
MG1: Normal modulation control, MG2: Normal modulation control $$\alpha\_all\_1 = \alpha\_mg1\_1 + \alpha\_mg2\_1 + \alpha\_dcdc$$

$$\beta\_all\_1 = \beta\_mg1\_1 + \beta\_mg2\_1 + \beta\_dcdc$$

$$\gamma\_all\_1 = \gamma\_mg1\_1 + \gamma\_mg2\_1 + \gamma\_dcdc$$

2) Second Combination
MG1: Overmodulation control, MG2: Overmodulation control $$\alpha\_all\_2 = \alpha\_mg1\_2 + \alpha\_mg2\_2 + \alpha\_dcdc$$

$$\beta\_all\_2 = \beta\_mg1\_2 + \beta\_mg2\_2 + \beta\_dcdc$$

$$\gamma\_all\_2 = \gamma\_mg1\_2 + \gamma\_mg2\_2 + \gamma\_dcdc$$

3) Third combination . . . (9)
MG1: Normal modulation control, MG2: Overmodulation control $$\alpha\_all\_3 = \alpha\_mg1\_1 + \alpha\_mg2\_2 + \alpha\_dcdc$$

$$\beta\_all\_3 = \beta\_mg1\_1 + \beta\_mg2\_2 + \beta\_dcdc$$

$$\gamma\_all\_3 = \gamma\_mg1\_1 + \gamma\_mg2\_2 + \gamma\_dcdc$$

4) Fourth combination
MG1: Overmodulation control, MG2: Normal modulation control $$\alpha\_all\_4 = \alpha\_mg1\_2 + \alpha\_mg2\_1 + \alpha\_dcdc$$

$$\beta\_all\_4 = \beta\_mg1\_2 + \beta\_mg2\_1 + \beta\_dcdc$$

$$\gamma\_all\_4 = \gamma\_mg1\_2 + \gamma\_mg2\_1 + \gamma\_dcdc$$

Then, about each combination, the voltage command calculation unit 803 calculates a total loss minimum voltage VHF which is the system voltage that the sum total power loss becomes the minimum, based on the each order total coefficient $\alpha\_all$, $\beta\_all$, and $\gamma\_all$.

In the present embodiment, since the 2nd-order total coefficient $\alpha\_all$ of each combination becomes a positive value, the sum total power loss becomes a downwardly projected. Then, if voltage limitation described below is not performed, the sum total power loss becomes the minimum at the extremum. As shown in a next equation, about each combination, the voltage command calculation unit 803 calculates an extremum of the 2nd-order polynomial, based on the 2nd-order total coefficient $\alpha\_all$ and the 1st-order total coefficient $\beta\_all$, and calculates the extremum as the total loss minimum voltage VHP.

$$VHP\_1 = -\beta\_all\_1/(2 \times \alpha\_all\_1)$$

$$VHP\_2 = -\beta\_all\_2/(2 \times \alpha\_all\_2) \quad (10)$$

$$VHP\_3 = -\beta\_all\_3/(2 \times \alpha\_all\_3)$$

$$VHP\_4 = -\beta\_all\_4/(2 \times \alpha\_all\_4)$$

According to this configuration, without calculating the sum total power loss at each operating point of the system voltage VH, the total loss minimum voltage VHP can be calculated by the extremum of the 2nd-order polynomial, and computation load can be reduced significantly.

If the 2nd-order total coefficient $\alpha\_all$ becomes a negative value, or if the 3rd-order or higher, or 1st-order polynomial is used, about each combination, instead of the extremum of the 2nd-order polynomial, the voltage command calculation unit 803 may calculate the system voltage VH that the sum total power loss becomes the minimum in the voltage range from the power source voltage Vb to the output upper limit voltage Vcnmax of the converter, and may set it as the total loss minimum voltage VHP.

<Determination of Executable Combination>

The voltage command calculation unit 803 determines whether or not each combination can be performed, based on the power source voltage Vb, the output upper limit voltage Vcnmax of the converter, the first border voltage Vmg1, and the second border voltage Vmg2.

Specifically, as shown in a next equation, when both of the first border voltage Vmg1 and the second border voltage Vmg2 is less than or equal to the output upper limit voltage Vcnmax of the converter, the voltage command calculation unit 803 determines that the first combination (MG1: normal modulation control, MG2: normal modulation control) can be performed; and otherwise, the voltage command calculation unit 803 determines that the first combination cannot be performed.

1) When Vmg<=Vcnmax, and Vmg2<=Vcnmax
   First combination is executable
2) Otherwise . . . (11)
   First combination is unexecutable As shown in a next equation, when both of the first border voltage Vmg1 and the second border voltage Vmg2 is larger than the power source voltage Vb, the voltage command calculation unit 803 determines that the second combination (MG1: overmodulation control, MG2: overmodulation control) can be performed; and otherwise, the voltage command calculation unit 803 determines that the second combination cannot be performed.

1) When Vb<Vmg1, and Vb<Vmg2
   Second combination is executable
2) Otherwise . . . (12)
   Second combination is unexecutable As shown in a next equation, when the first border voltage Vmg1 is less than or equal to the output upper limit voltage Vcnmax of the converter, the second border voltage Vmg2 is larger than the power source voltage Vb, and the first border voltage Vmg1 is smaller than the second border voltage Vmg2, the voltage command calculation unit 803 determines that the third combination (MG1: normal modulation control, MG2: overmodulation control) can be performed; and otherwise, the voltage command calculation unit 803 determines that the third combination cannot be performed.

1) When Vmg1<=Vcnmax, Vb<Vmg2, and Vmg1<Vmg2
   Third combination is executable
2) Otherwise . . . (13)
   Third combination is unexecutable As shown in a next equation, when the first border voltage Vmg1 is larger than the power source voltage Vb, the second border voltage Vmg2 is less than or equal to the output upper limit voltage Vcnmax of the converter, and the second border voltage Vmg2 is smaller than the first border voltage Vmg1, the voltage command calculation unit 803 determines that the fourth combination (MG1: overmodulation control, MG2: normal modulation control) can be performed; and otherwise, the voltage command calculation unit 803 determines that the fourth combination cannot be performed.

1) When Vb<Vmg1, Vmg2<=Vcnmax, and Vmg2<Vmg1
   Fourth combination is executable
2) Otherwise . . . (14)
   Fourth combination is unexecutable Since the third combination is required to establish Vmg1<Vmg2, and the fourth combination is required to establish Vmg2<Vmg1, either one of the third combination and the fourth combination can be performed.

<Calculation of Candidate Value and Minimum Sum Total Power Loss of Executable Each Combination>

About each combination determined as executable, the voltage command calculation unit 803 calculates the minimum value Ploss_min of sum total power loss, and the candidate value VHtp of the converter voltage command value, based on the total value of each order coefficient.

Figure 16:
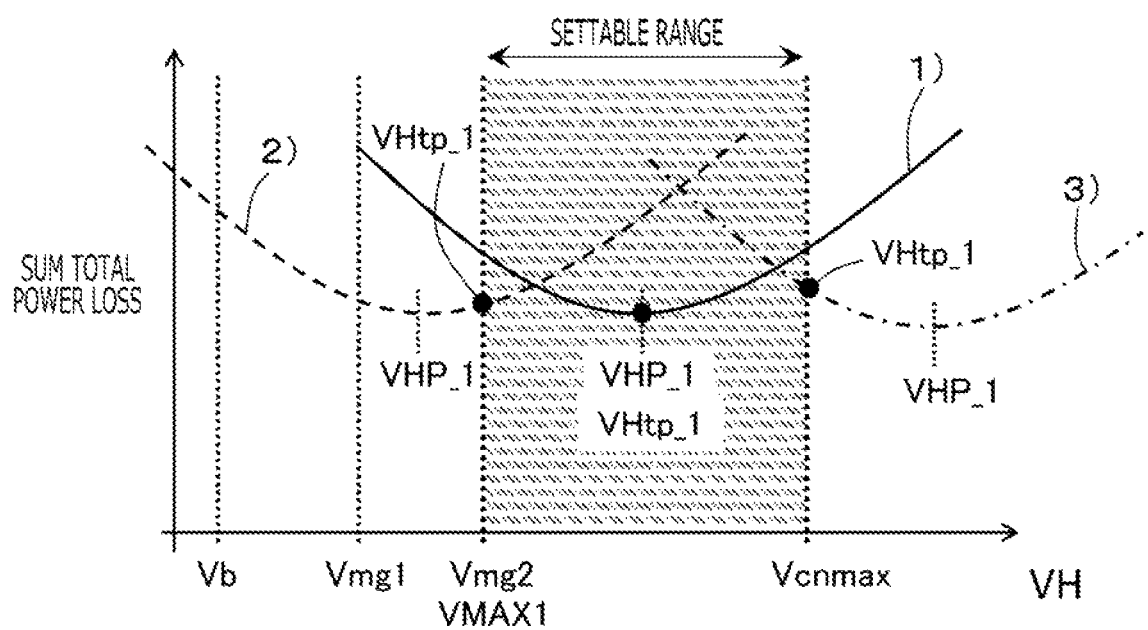
FIG. 16 is a figure for explaining calculation of the candidate value of the converter voltage command value of the first combination according to Embodiment 1.

In the case where the first combination can be performed, as shown in a next equation and FIG. 16, when the total loss minimum voltage VHP_1 of the first combination is greater than or equal to the maximum value VMAX1 among the first border voltage Vmg1, the second border voltage Vmg2, and the power source voltage Vb, and is less than or equal to the output upper limit voltage Vcnmax of the converter, since the sum total power loss becomes the minimum at the total loss minimum voltage VHP_1 of the first combination, the voltage command calculation unit 803 sets the total loss minimum voltage VHP_1 of the first combination, as the candidate value VHtp_1 of the converter voltage command value of the first combination. When the total loss minimum voltage VHP_1 of the first combination is smaller than the maximum value VMAX1, since the sum total power loss becomes the minimum at the maximum value VMAX1, the voltage command calculation unit 803 sets the maximum value VMAX1, as the candidate value VHtp_1 of the converter voltage command value of the first combination. When the total loss minimum voltage VHP_1 of the first combination is larger than the output tipper limit voltage Vcnmax of the converter, since the sum total power loss becomes the minimum at the output upper limit voltage Vcnmax of the converter, the voltage command calculation unit 803 sets the output upper limit voltage Vcnmax, as the candidate value VHtp_1 of the converter voltage command value of the first combination. Here, MAX (A, B, C) is a function which outputs the largest value among A, B, and C.

$$VMAX1=MAX(Vmg1,Vmg2,Vb) \quad (15)$$

1) When VMAX1<=VHP_1<=Vcnmax $$VHtp\_1=VHP\_1$$

2) When VHP_1<VMAX1

$$VHtp\_1=VMAX1$$

3) When Vcnmax<VHP_1

$$VHtp\_1=Vcnmax$$

If the 2nd-order total coefficient α_all_1 of the first combination becomes a negative value, or if the 3rd-order or higher, or 1st-order polynomial is used, the voltage command calculation unit 803 may calculate the system voltage VH that the sum total power loss becomes the minimum in a settable range of the candidate value VHtp_1 of the first combination (from VMAX1 to Vcnmax), as the candidate value VHtp_1 of the first combination.

Then, as shown in a next equation, the voltage command calculation unit 803 calculates the minimum sum total power loss Ploss_min_1 of the first combination at the calculated candidate value VHtp_1 of the converter voltage command value of the first combination.

$$Ploss\_min\_1=\alpha\_all\_1 \cdot VHtp\_1^2+\beta\_all\_1 \cdot VHtp\_1+\gamma\_all\_1 \quad (16)$$

Figure 17:
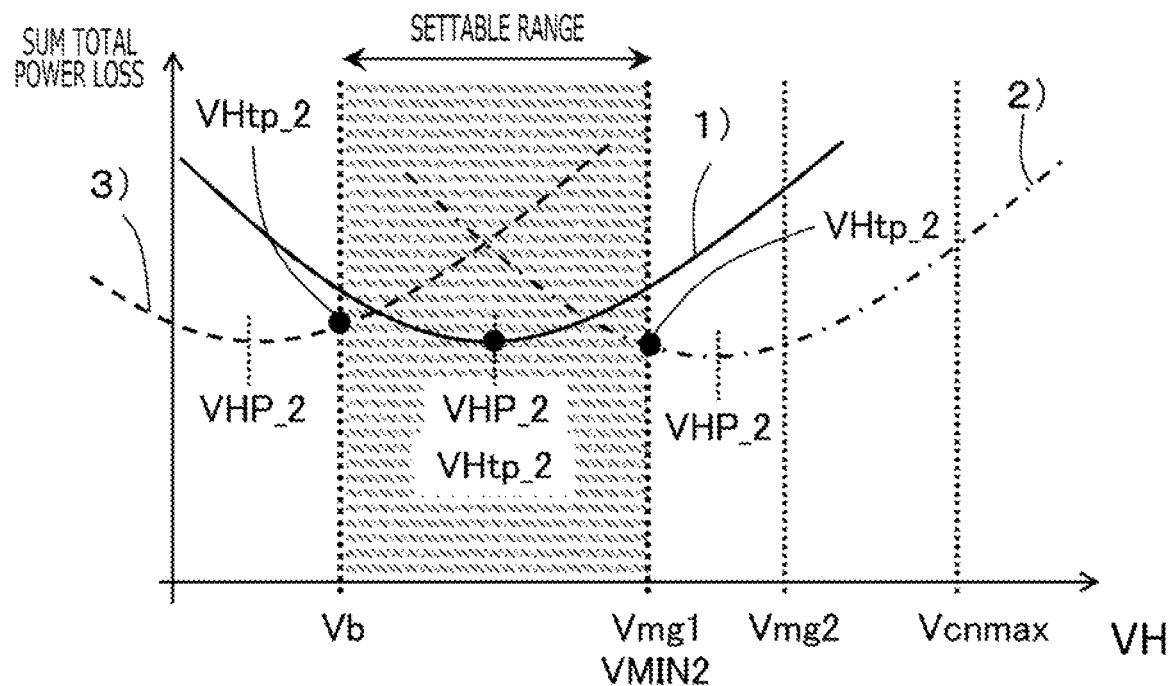
FIG. 17 is a figure for explaining calculation of the candidate value of the converter voltage command value of the second combination according to Embodiment 1.

In the case where the second combination can be performed, as shown in a next equation and FIG. 17, when the total loss minimum voltage VHP_2 of the second combination is greater than or equal to the power source voltage Vb, and is less than or equal to the minimum value VMIN2 among the first border voltage Vmg1, the second border voltage Vmg2, and the output upper limit voltage Vcnmax of the converter, since the sum total power loss becomes the minimum at the total loss minimum voltage VHP_2 of the second combination, the voltage command calculation unit 803 sets the total loss minimum voltage VHP_2 of the second combination, as the candidate value VHtp_2 of the converter voltage command value of the second combination. When the total loss minimum voltage VHP_2 of the second combination is larger than the minimum value VMIN2, since the sum total power loss becomes the minimum at the minimum value VMIN2, the voltage command calculation unit 803 sets the minimum value VMIN2, as the candidate value VHtp_2 of the converter voltage command value of the second combination. When the total loss minimum voltage VHP_2 of the second combination is smaller than the power source voltage Vb, since the sum total power loss becomes the minimum at the power source voltage Vb, the voltage command calculation unit 803 sets the power source voltage Vb, as the candidate value VHtp_2 of the converter voltage command value of the second combination. Here, MIN (A, B, C) is a function which outputs the smallest value among A, B, and C.

$$VMIN2=MIN(Vmg1,Vmg2,Vcnmax) \quad (17)$$

1) When Vb<=VHP_2<=VMIN2

$$VHtp\_2=VHP\_2$$

2) When VMIN2<VHP_2

$$VHtp\_2=VMIN2$$

3) When VHP_2<Vb $$VHtp\_2=Vb$$

If the 2nd-order total coefficient α_all_2 of the second combination becomes a negative value, or if the 3rd-order or higher, or 1st-order polynomial is used, the voltage command calculation unit 803 may calculate the system voltage VH that the sum total power loss becomes the minimum in a settable range of the candidate value VHtp_2 of the second combination (from Vb to VMIN2), as the candidate value VHtp_2 of the second combination.

Then, as shown in a next equation, the voltage command calculation unit 803 calculates the minimum sum total power loss Ploss_min_2 of the second combination at the calculated candidate value VHtp_2 of the converter voltage command value of the second combination.

$$Ploss\_min\_2=\alpha\_all\_2 \cdot VHtp\_2^2+\beta\_all\_2 \cdot VHtp\_2+\gamma\_all\_2 \quad (18)$$

Figure 18:
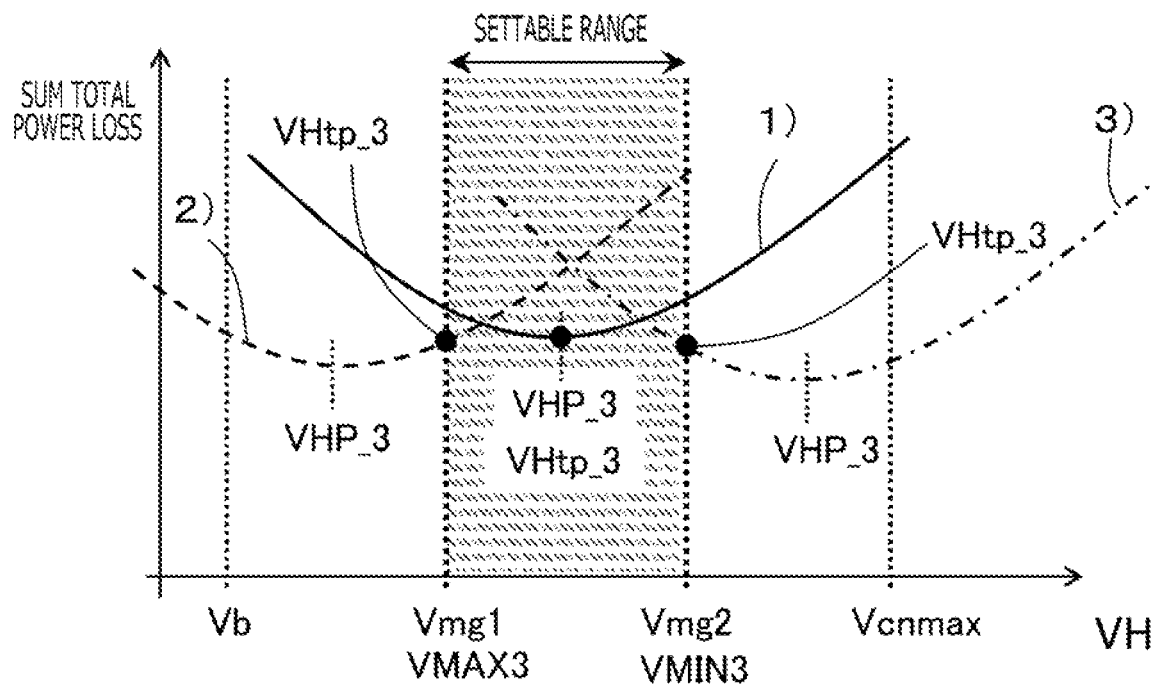
FIG. 18 is a figure for explaining calculation of the candidate value of the converter voltage command value of the third combination according to Embodiment 1.

In the case where the third combination can be performed, as shown in a next equation and FIG. 18, when the total loss minimum voltage VHP_3 of the third combination is the greater than or equal to the maximum values VMAX3 between the first border voltage Vmg1 and the power source voltage Vb, and is less than or equal to the minimum value VMIN3 between the second border voltage Vmg2 and the output upper limit voltage Vcnmax of the converter, since the sum total power loss becomes the minimum at the total loss minimum voltage VHP_3 of the third combination, the voltage command calculation unit 803 sets the total loss minimum voltage VHP_3 of the third combination, as the candidate value VHtp_3 of the converter voltage command value of the third combination. When the total loss minimum voltage VHP_3 of the third combination is smaller than the maximum value VMAX3, since the sum total power loss becomes the minimum at the maximum value VMAX3, the voltage command calculation unit 803 sets the maximum value VMAX3, as the candidate value VHtp_3 of the converter voltage command value of the third combination. When the total loss minimum voltage VHP_3 of the third combination is larger than the minimum value VMIN3, the voltage command calculation unit 803 sets the minimum value VMIN3, as the candidate value VHtp_3 of the converter voltage command value of the third combination.

$$VMAX3 = MAX(Vmg1, Vb) \quad (19)$$

$$VMIN3 = MIN(Vmg2, Vcnmax)$$

1) When VMAX3<=VHP_3<=VMIN3

$$VHtp\_3 = VHP\_3$$

2) When VHP_3<VMAX3

$$VHtp\_3 = VMAX3$$

3) when VMIN3<VHP_3

$$VHtp\_3 = VMIN3$$

If the 2nd-order total coefficient $\alpha\_all\_3$ of the third combination becomes a negative value, or if the 3rd-order or higher, or 1st-order polynomial is used, the voltage command calculation unit 803 may calculate the system voltage VH that the sum total power loss becomes the minimum in a settable range of the candidate value VHtp_3 of the third combination (from VMAX3 to VMIN 3), as the candidate value VHtp_3 of the third combination.

Then, as shown in a next equation, the voltage command calculation unit 803 calculates the minimum sum total power loss Ploss_pin_3 of the third combination at the calculated candidate value VHtp_3 of the converter voltage command value of the third combination.

$$Ploss\_min\_3 = \alpha\_all\_3 \cdot VHtp\_3^2 + \beta\_all\_3 \cdot VHtp\_3 + \gamma\_all\_3 \quad (20)$$

In the case where the fourth combination can be performed, as shown in a next equation and FIG. 19, when total loss minimum voltage VHP_4 of the fourth combination is greater than or equal to the maximum values VMAX4 between the second border voltage Vmg2 and the power source voltage Vb, and is less than or equal to the minimum value VMIN4 between the first border voltage Vmg1 and the output upper limit voltage Vcnmax of the converter, since the sum total power loss becomes the minimum at the total loss minimum voltage VHP_4 of the fourth combination, the voltage command calculation unit 803 sets the total loss minimum voltage VHP_4 of the fourth combination, as the candidate value VHtp_4 of the converter voltage command value of the fourth combination. When the total loss minimum voltage VHP_4 of the fourth combination is smaller than the maximum value VMAX4, since the sum total power loss becomes the minimum at the maximum value VMAX4, the voltage command calculation unit 803 sets the maximum value VMAX4, as the candidate value VHtp_4 of the converter voltage command value of the fourth combination. When the total loss minimum voltage VHP_4 of the fourth combination is larger than the minimum value VMIN4, the voltage command calculation unit 803 sets the minimum value VMIN4, as the candidate value VHtp_4 of the converter voltage command value of the fourth combination.

$$VMAX4 = MAX(Vmg2, Vb) \quad (21)$$

$$VMIN4 = MIN(Vmg1, Vcnmax)$$

1) When VMAX4<=VHP_4<=VMIN4

$$VHtp\_4 = VHP\_4$$

2) When VHP_4<VMAX4

$$VHtp\_4 = VMAX4$$

3) When VMIN4<VHP_4

$$VHtp\_4 = VMIN4$$

If the 2nd-order total coefficient $\alpha\_all\_4$ of the fourth combination becomes a negative value, or if the 3rd-order or higher, or let-order polynomial is used, the voltage command calculation unit 803 may calculate the system voltage VH that the sum total power loss becomes the minimum in a settable range of the candidate value VHtp_4 of the fourth combination (from VMAX4 to VMIN4), as the candidate value VHtp_4 of the fourth combination.

Then, as shown in a next equation, the voltage command calculation unit 803 calculates the minimum sum total power loss Ploss_min_4 of the fourth combination at the calculated candidate value VHtp_4 of the converter voltage command value of the fourth combination.

$$Ploss\_min\_4 = \alpha\_all\_4 \cdot VHtp\_4^2 + \beta\_all\_4 \cdot VHtp\_4 + \gamma\_all\_4 \quad (22)$$

As shown in a next equation, the voltage command calculation unit 803 determines the minimum value Ploss_minall among the minimum sum total power losses Ploss_min_1, Ploss_min_2, Ploss_min_3, and Ploss_min_4 of executable the first combination to the fourth combination, and sets the candidate value VHtp of the converter voltage command value of the combination corresponding to the determined minimum value Ploss_minall, as the converter voltage command value VH #. Herein, as mentioned above, since the fourth combination and the third combination can be performed alternatively, any one of the minimum sum total power loss Ploss_min is used. For example, if the minimum sum total power loss Ploss_min_1 of the first combination becomes the minimum value, the candidate value VHtp_1 of the converter voltage command value of the first combination is set as the converter voltage command value VH #.

$$Ploss\_minall = MIN(Ploss\_min\_1, Ploss\_min\_2, Ploss\_min\_3 \text{ or } Ploss\_min\_4)$$

$$VH\ \# = VHtp \text{ of combination corresponding to } Ploss\_minall \quad (23)$$

<Consideration of Loss Due to Command Value Change>

The voltage command calculation unit 803 calculates a changing power loss LossMove due to changing from the converter voltage command value VH # which is set in the last time calculation cycle into the converter voltage command value VH # which is calculated by the equation (23) in this time calculation cycle; and calculates a maintaining power loss LossCur due to maintaining to the converter voltage command value VH # which is set in the last time calculation cycle. Then, when the maintaining power loss LossCur exceeds the changing power loss LossMove, the voltage command calculation unit 803 sets the converter voltage command value VH # calculated in this time calculation cycle, as the final setting value. On the other hand, when the maintaining power loss LossCur is below the changing power loss LossMove, the voltage command calculation unit 803 sets the converter voltage command value VH # which is set in the last time calculation cycle, as the final setting value.

<Example of Conversion>

There has been explained the case where the converter voltage command calculation unit 700 calculates the power loss characteristics (coefficients of polynomial) of total of the rotary electric machine and the inverter. However, the converter voltage command calculation unit 700 may calculates the power loss characteristics (coefficients of polynomial) of the rotary electric machine, and the power loss characteristics (coefficients of polynomial) of the inverter, respectively, and may total two calculated power loss characteristics (coefficients of polynomial).

If the power loss characteristics of the rotary electric machine is unknown, the converter voltage command calculation unit 700 may calculate the power loss characteristics (coefficients of polynomial) of only the inverter. Even in this case, since the increase in the switching loss and the energization loss in the magnetic flux weakening control can be expressed, the converter voltage command value VH # which makes the power loss the minimum can be calculated with good accuracy generally. If the power loss characteristics of the converter is unknown, the converter voltage command calculation unit 700 may calculate the power loss characteristics of the rotary electric machine and the inverter, or the power loss characteristics of the inverter, without calculating the power loss characteristics of the converter.

There has been explained the case where the 2nd-order polynomial is used about each power loss characteristics. However, the 1st-order polynomial, or the 3rd-order or higher-order polynomial may be used about each power loss characteristics. Even in this case, about each combination, the existing coefficients of each order are totaled. In this case, as mentioned above, about each combination, instead of the extremum of the 2nd-order polynomial, the system voltage VH that the sum total power loss becomes the minimum in the voltage range from the power source voltage Vb to the output upper limit voltage Vcnmax of the converter may be calculated based on the total coefficient of each order, and it may be set as the total loss minimum voltage VHP.

2. Embodiment 2

The controller 400 according to Embodiment 2 will be explained. The explanation for constituent parts the same as those in Embodiment 1 will be omitted. The basic configuration of the controller 400 according to the present embodiment is the same as that of Embodiment 1. Calculation processing of the converter voltage command calculation unit 700 is different from Embodiment 1.

Depending on inductance and constant of the capacitor used for the converter 15, and the operating point of the rotary electric machine, when the system voltage VH which becomes the output voltage of the converter 15 is close to the power source voltage Vb, the system voltage VH may oscillate.

Then, in the present embodiment, the converter voltage command calculation unit 700 set any larger one of the converter voltage command value VH # which is calculated in Embodiment 1 and makes the power loss the minimum, and an avoidance minimum voltage VHav which is a minimum system voltage required for avoiding instability of the rotary electric machine apparatus, as the final converter voltage command value VH #. The converter voltage command calculation unit 700 calculates the avoidance minimum voltage VHav, based on the operating points of the rotary electric machine (the torque command value Tqcom and the rotational angle speed ω of each rotary electric machine, the total output PMOT_ALL of two rotary electric machines, and the like). For example, the avoidance minimum voltage VHav is calculated by adding the voltage width ΔVth for avoiding oscillation to the power source voltage Vb.

According to this configuration, while reducing power loss, oscillation of the system voltage VH can be suppressed.

3. Embodiment 3

The controller 400 according to Embodiment 3 will be explained. The explanation for constituent parts the same as those in Embodiment 1 will be omitted. The basic configuration of the controller 400 according to the present embodiment is the same as that of Embodiment 1. Calculation processing of the converter voltage command calculation unit 700 is different from Embodiment 1.

When the field weakening control is performed in one or both of the first and the second rotary electric machines MG1, MG2, the direct-current side current of each inverter may oscillate easily. Therefore, in the case where the field weakening control is performed, as similar to Embodiment 2, when the system voltage VH is close to the power source voltage Vb, the system voltage VH may oscillate.

Then, in the present embodiment, the converter voltage command calculation unit 700 sets any larger one of the converter voltage command value VH # which is calculated in Embodiment 1 when the inverter control unit 600 calculates the three-phase voltage command values for performing the field weakening control and makes the power loss the minimum, and the avoidance minimum voltage VHav which is a minimum system voltage required for avoiding instability of the rotary electric machine apparatus, as the final converter voltage command value VH #. As similar to Embodiment 2, the converter voltage command calculation unit 700 calculates the avoidance minimum voltage VHav, based on the operating points of the rotary electric machine (the torque command value Tqcom and the rotational angle speed ω of each rotary electric machine, the total output PMOT_ALL of two rotary electric machines, and the like). For example, the avoidance minimum voltage VHav is calculated by adding the voltage width ΔVth for avoiding oscillation to the power source voltage Vb.

According to this configuration, while reducing power loss, oscillation of the system voltage VH due to execution of the field weakening control can be suppressed.

Other Embodiments (1) In each of above embodiments, there has been explained the case where 2 sets of the rotary electric machine MG and the inverter IN are provided, and the controller 400 is configured in accordance with the first set and the second set. However, 1 set, 3 sets, or more than 3 sets of the rotary electric machine MG and the inverter IN may be provided. The controller 400 is appropriately configured in accordance with the number of sets.

(2) In each of above embodiments, the approximate expression of the power loss and the calculation example of the coefficients about the converter 15, the inverter IN, and the rotary electric machine MG are only representative ones. These can be calculated based on other methods or other variables. Also in the case where the number of the converter 15, the number of the inverter IN, and the number of the rotary electric machine MG increase, these loss characteristics can be approximated similarly, coefficients can be calculated similarly, and the converter voltage command value VH # at which the power loss becomes the minimum can be set.

(3) Limiting to a part of the power loss characteristics of the converter, the power loss characteristics of the inverter, and the power loss characteristics of the rotary electric machine, in which a change degree with respect to change of the system voltage VH is large, coefficients when the power loss characteristics is approximated by the polynomial may be calculated, and the converter voltage command value VH # at which the power loss characteristics becomes the minimum may be set based on the calculated coefficients.

(4) In each of above embodiments, there has been explained the case where the rotary electric machine apparatus 1000 is mounted on the hybrid vehicle. However, the rotary electric machine apparatus 1000 may be a driving force source of other apparatus other than the hybrid vehicle, such as being mounted on the electric vehicle.

Although the present disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A controller for rotary electric machine apparatus that controls a rotary electric machine apparatus which is provided with a rotary electric machine which has plural-phase windings, a converter which can raise a power source voltage of a direct current power source to output to a system voltage line, and an inverter which is provided between the converter and the rotary electric machine and performs power conversion between the direct current power of the system voltage line and alternating current power which drives the rotary electric machine, the controller for rotary electric machine apparatus comprising at least one processor configured to implement:

a converter voltage command calculator that calculates a converter voltage command value within a range of greater than or equal to the power source voltage and less than or equal to an output upper limit voltage of the converter, a converter controller that controls the converter so that a system voltage which is a direct current voltage of the system voltage line approaches the converter voltage command value, and an inverter controller that calculates plural-phase voltage command values, and controls the inverter based on the plural-phase voltage command values to apply voltages to the plural-phase windings, wherein the inverter controller switches and performs a normal modulation control in which amplitudes of the plural-phase voltage command values become less than or equal to a half value of the system voltage, and an overmodulation control in which the amplitudes of the plural-phase voltage command values exceed the half value of the system voltage, and wherein the converter voltage command calculator sets the system voltage that a power loss becomes a minimum, as the converter voltage command value, based on a power loss characteristics of the normal modulation control which is a power loss characteristics of at least the inverter with respect to the system voltage in performing the normal modulation control, and a power loss characteristics of the overmodulation control which is a power lose characteristics of at least the inverter with respect to the system voltage in performing the overmodulation control.

2. The controller for rotary electric machine apparatus according to claim 1, wherein the converter voltage command calculator calculates a minimum value of the power loss in performing the normal modulation control, and the system voltage at the calculated minimum value of the power loss, based on the power loss characteristics of the normal modulation control;

calculates a minimum value of the power loss in performing the overmodulation control, and the system voltage at the calculated minimum value of the power loss, based on the power loss characteristics of the overmodulation control; and determines any smaller one of the minimum value of the power loss in performing the normal modulation control and the minimum value of the power loss in performing the overmodulation control, and sets the system voltage at the determined smaller one, as the converter voltage command value.

3. The controller for rotary electric machine apparatus according to claim 1, wherein the converter voltage command calculator sets the system voltage that a sum total power loss of the inverter, the rotary electric machine, and the converter becomes a minimum, as the converter voltage command value, based on the power loss characteristics of the normal modulation control which is a power loss characteristics of the inverter and the rotary electric machine with respect to the system voltage in performing the normal modulation control, the power loss characteristics of the overmodulation control which is a power loss characteristics of the inverter and the rotary electric machine with respect to the system voltage in performing the overmodulation control, and a power loss characteristics of the converter with respect to the system voltage.

4. The controller for rotary electric machine apparatus according to claim 1, wherein the converter voltage command calculator sets the system voltage that a sum total power loss of the inverter and the converter becomes a minimum, as the converter voltage command value, based on the power loss characteristics of the normal modulation control which is a power loss characteristics of the inverter with respect to the system voltage in performing the normal modulation control, the power loss characteristics of the overmodulation control which is a power loss characteristics of the inverter with respect to the system voltage in performing the overmodulation control, and a power loss characteristics of the converter with respect to the system voltage.

5. The controller for rotary electric machine apparatus according to claim 1, wherein the converter voltage command calculator calculates coefficients of respective orders of a polynomial which represents each power loss characteristics and uses the system voltage as a variable.

6. The controller for rotary electric machine apparatus according to claim 5, wherein the polynomial is a polynomial whose order is smaller than or equal to the 2nd-order.

7. The controller for rotary electric machine apparatus according to claim 1, wherein a plurality of sets of the rotary electric machine and the inverter are provided, and wherein the converter voltage command calculator sets the system voltage that a power loss obtained by totaling a plurality of sets becomes a minimum, as the converter voltage command value, based on each set of the power loss characteristics of the normal modulation control and the power loss characteristics of the overmodulation control.

8. The controller for rotary electric machine apparatus according to claim 7, wherein the converter voltage command calculator, about each of a plurality of combinations which combined the case where the normal modulation control or the overmodulation control is performed in each set, calculates a minimum value of power loss and calculates the system voltage at the calculated minimum value as a candidate value of the converter voltage command value, based on each set of the power loss characteristics of the normal modulation control or the power loss characteristics of the overmodulation control; and determines the combination that the minimum value of the power lose becomes the smallest in the plurality of combinations, and sets the candidate value of the converter voltage command value in the determined combination, as the converter voltage command value.

9. The controller for rotary electric machine apparatus according to claim 8, wherein the converter voltage command calculator calculates coefficients of respective orders of a polynomial which represents each power loss characteristics and uses the system voltage as a variable; and about each of the plurality of combinations, totals the coefficients of corresponding respective power loss characteristics for each order of the polynomials, and calculates the minimum value of power loss and the candidate value of the converter voltage command value, based on the total value of the coefficients of each order.

10. The controller for rotary electric machine apparatus according to claim 8, wherein the converter voltage command calculator, about each set, calculates a border voltage which is the minimum system voltage required in the case of performing the normal modulation control;

determines whether or not each combination can be performed, based on the power source voltage, an output upper limit voltage of the converter, and the border voltage of each set; and about each combination determined as executable, calculates the minimum value of power loss and the candidate value of the converter voltage command value, based on the total value of the coefficients of each order.

11. The controller for rotary electric machine apparatus according to claim 1, wherein the converter voltage command calculator sets any larger one of the system voltage that a power loss becomes a minimum and the minimum system voltage required for avoiding instability of the rotary electric machine apparatus, as the converter voltage command value.

12. The controller for rotary electric machine apparatus according to claim 1, wherein when the inverter controller calculates the plural-phase voltage command values for performing a field weakening control, the converter voltage command calculator sets any larger one of the system voltage that a power loss becomes a minimum, and the minimum system voltage required for avoiding instability of the rotary electric machine apparatus, as the converter voltage command value.

\* \* \* \* \*